(12) United States Patent
Adachi et al.

(10) Patent No.: US 11,637,184 B2
(45) Date of Patent: Apr. 25, 2023

(54) SILICON CARBIDE SEMICONDUCTOR DEVICE, POWER CONVERTER, METHOD OF MANUFACTURING SILICON CARBIDE SEMICONDUCTOR DEVICE, AND METHOD OF MANUFACTURING POWER CONVERTER

(71) Applicant: Mitsubishi Electric Corporation, Tokyo (JP)

(72) Inventors: Kohei Adachi, Tokyo (JP); Katsutoshi Sugawara, Tokyo (JP); Yutaka Fukui, Tokyo (JP); Hideyuki Hatta, Tokyo (JP); Rina Tanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 75 days.

(21) Appl. No.: 16/473,251

(22) PCT Filed: Jan. 11, 2018

(86) PCT No.: PCT/JP2018/000406
§ 371 (c)(1),
(2) Date: Jun. 25, 2019

(87) PCT Pub. No.: WO2018/163593
PCT Pub. Date: Sep. 13, 2018

(65) Prior Publication Data
US 2020/0194554 A1 Jun. 18, 2020

(30) Foreign Application Priority Data
Mar. 6, 2017 (JP) .............................. JP2017-041303

(51) Int. Cl.
*H01L 29/10* (2006.01)
*H01L 29/16* (2006.01)
(Continued)

(52) U.S. Cl.
CPC ...... *H01L 29/1045* (2013.01); *H01L 29/1608* (2013.01); *H01L 29/66068* (2013.01);
(Continued)

(58) Field of Classification Search
CPC ............. H01L 29/1045; H01L 29/1608; H01L 29/66068; H01L 29/7397; H01L 29/7813
See application file for complete search history.

(56) References Cited

U.S. PATENT DOCUMENTS 9,543,422 B1 1/2017 Takahashi
2005/0161732 A1* 7/2005 Mizukami ........... H01L 29/8083
257/327
(Continued)

FOREIGN PATENT DOCUMENTS

JP 2005-142243 A 6/2005
JP 2007-294759 A 11/2007
(Continued)

OTHER PUBLICATIONS

International Search Report and Written Opinion dated Mar. 6, 2018 for PCT/JP2018/000406 filed on Jan. 11, 2018, 14 pages including English Translation of the International Search Report.
(Continued)

Primary Examiner — Brigitte A Paterson
(74) Attorney, Agent, or Firm — Xsensus LLP

(57) ABSTRACT

A drift layer is formed of silicon carbide and has a first conductivity type. A trench bottom protective layer is provided on a bottom portion of a gate trench and has a second conductivity type. A depletion suppressing layer is provided between a side surface of the gate trench and the drift layer, extends from a lower portion of a body region up to a position deeper than the bottom portion of the gate trench, has the first conductivity type, and has an impurity concentration of the first conductivity type higher than that of the
(Continued)

drift layer. The impurity concentration of the first conductivity type of the depletion suppressing layer is reduced as the distance from the side surface of the gate trench becomes larger.

4 Claims, 26 Drawing Sheets

(51) Int. Cl.
    *H01L 29/66*     (2006.01)
    *H01L 29/78*     (2006.01)
    *H01L 29/739*     (2006.01)
    *H02M 1/08*     (2006.01)
    *H02M 7/5387*     (2007.01)
    *H01L 21/04*     (2006.01)

(52) U.S. Cl.
    CPC ...... *H01L 29/7397* (2013.01); *H01L 29/7813* (2013.01); *H02M 1/08* (2013.01); *H02M 7/53871* (2013.01); *H01L 21/047* (2013.01)

(56) References Cited

U.S. PATENT DOCUMENTS

| | | |
|---|---|---|
| 2006/0289928 A1 | 12/2006 | Takaya et al. |
| 2011/0291110 A1* | 12/2011 | Suzuki ............... H01L 29/0878 257/77 |
| 2013/0285140 A1 | 10/2013 | Kagawa et al. |
| 2014/0264564 A1* | 9/2014 | Cheng ................. H01L 29/7827 257/330 |
| 2015/0349115 A1 | 12/2015 | Tega et al. |
| 2016/0211334 A1 | 7/2016 | Tanaka et al. |
| 2016/0247910 A1* | 8/2016 | Suzuki .............. H01L 29/66068 |
| 2016/0336391 A1* | 11/2016 | Tanaka ................... H01L 29/12 |
| 2017/0025516 A1* | 1/2017 | Saito ................... H01L 29/0615 |
| 2017/0141223 A1* | 5/2017 | Hoshi ................. H01L 29/7813 |
| 2018/0240879 A1 | 8/2018 | Tolksdorf et al. |

FOREIGN PATENT DOCUMENTS

| | | | |
|---|---|---|---|
| JP | 2010-232627 A | 10/2010 | |
| JP | 2010232627 A | * 10/2010 | ....... H01L 21/26586 |
| JP | 2015-072999 A | 4/2015 | |
| JP | 2015-133447 A | 7/2015 | |
| JP | 2016-523454 A | 8/2016 | |
| JP | 2016-162855 A | 9/2016 | |
| JP | 2017-045874 A | 3/2017 | |
| WO | 2012/077617 A1 | 6/2012 | |
| WO | 2014/115253 A1 | 7/2014 | |
| WO | 2015/049815 A1 | 4/2015 | |

OTHER PUBLICATIONS

Office Action dated Dec. 1, 2022, in corresponding Chinese patent Application No. 201880012998.3, 18 pages.

* cited by examiner

SILICON CARBIDE SEMICONDUCTOR DEVICE, POWER CONVERTER, METHOD OF MANUFACTURING SILICON CARBIDE SEMICONDUCTOR DEVICE, AND METHOD OF MANUFACTURING POWER CONVERTER

CROSS-REFERENCE TO RELATED APPLICATIONS

The present application is based on PCT filing PCT/JP2018/000406, filed Jan. 11, 2018, which claims priority to JP 2017-041303, filed Mar. 6, 2017, the entire contents of each are incorporated herein by reference.

TECHNICAL FIELD

The present invention relates to a silicon carbide semiconductor device, a power converter, a method of manufacturing a silicon carbide semiconductor device, and a method of manufacturing a power converter, and more particularly to a silicon carbide semiconductor device having a trench gate, a power converter having a silicon carbide semiconductor device, a method of manufacturing a silicon carbide semiconductor device having a trench gate, and a method of manufacturing a power converter having a silicon carbide semiconductor device.

BACKGROUND ART

In a power electronics equipment, as a switching element which controls a supply of power to a load such as a motor or the like, an IGBT (Insulated Gate Bipolar Transistor) and a MOSFET (Metal Oxide Semiconductor Field Effect Transistor) are widely used. As the MOSFET used as a power semiconductor device, particularly, a vertical MOSFET is widely used. A trench gate type MOSFET is one type of vertical MOSFET. The trench gate type MOSFET uses a side surface of a trench formed on a surface of a semiconductor wafer, as a channel. Since this makes it possible to increase channel width density, it is possible to increase the performance of a device.

As a semiconductor material of the above-described power semiconductor device, in recent years, silicon carbide (SiC) which is a wide bandgap semiconductor begins to be applied. Since the Silicon carbide has a high dielectric breakdown electric field, the breakdown voltage of a semiconductor device can be increased. Therefore, the semiconductor device can be applied to a use using a higher voltage. In that case, however, when the semiconductor device as the switching element is brought into an OFF state, a high voltage is applied to the semiconductor device. As a result, even if a semiconductor region formed of silicon carbide, which can endure a high electric field, is not broken, the possibility that a gate insulating film may be broken by applying a high electric field becomes higher. In a trench gate type one, particularly, the distance between an upper surface of a semiconductor layer and a substrate becomes smaller at a bottom portion of the trench. Further, since an end of the bottom portion of the trench has an angular shape, the electric field is easily concentrated. From the above, there is an apprehension that the reliability of the gate insulating film on the bottom portion of the trench may be reduced.

In order to alleviate the electric field applied to the bottom portion of the trench, as disclosed in WO 2012/077517 (Patent Document 1), proposed is a structure in which an impurity layer having a conductivity type opposite to that of a drift layer is so formed as to cover the bottom portion of the trench. Specifically, a trench gate structure is provided in an n-type drift layer and a p-type protective layer is formed on a bottom surface of this structure. This protective layer protects the bottom portion of the trench from the electric field at the time when a high bias is applied between a drain electrode and a source electrode. It is thereby possible to keep the strength of the electric field low, which is applied to the gate insulating film formed in the vicinity of the bottom portion of the trench.

Thus, by protecting the trench bottom by the protective layer, the reliability can be increased. On the other hand, in this case, a JFET (Junction FET) region is formed between the adjacent trenches due to a depiction layer extending from the p-type protective layer and a p-type base region. When the MOSFET is conducting, a drain current flows in the JFET region sandwiched between these p-type regions. When the MOSFET is not conducting, the depletion Layer extends largely from these p-type regions, and even when the MOSFET is conducting, the depletion layer expands to some degree from the protective layer into the drift layer. As a result, a current path during conduction is narrowed. In other words, a JFET resistance is generated. An ON-resistance of the semiconductor device is thereby increased.

For this reason, as disclosed in Japanese Patent Application Laid Open Gazette No. 2015-072999 (Patent Document 2), proposed is a structure in which an n-type current dispersion layer having an impurity concentration higher than that of the drift layer is formed on the n-type drift layer. By forming the current dispersion layer, it is possible to suppress an extension of the depletion layer from the protective layer. Therefore, the current path is broadened. As a result, it is possible to reduce the JFET resistance. On the other hand, by providing the current dispersion layer having a high impurity concentration, the electric field strength further increases. There is an apprehension that the breakdown voltage may be reduced due to that. For example, there is an apprehension that the gate insulating film may be broken due to an increase in the strength of the electric field applied to the gate insulating film in an OFF time. As disclosed in above-described Japanese Patent Application Laid Open Gazette No. 2015-072999, there is a method of forming a p-type layer between the trenches in order to more reliably prevent a reduction in the breakdown voltage. In this case, the depletion layer extends not only from the p-type protective layer on the bottom portion of the trench but also from the p-type layer between the trenches. This supports the electric field in an OFF time more two-dimensionally. Therefore, it is possible to more reliably prevent a reduction in the breakdown voltage.

The depletion layer extending from the p-type layer between the trenches, however, has an effect also in an ON time of the MOSFET. Specifically, the area of the JFET region increases, the narrowing of the current path increases. As a result, the effect of reducing the ON-resistance by the n-type current dispersion layer cannot be achieved sufficiently.

PRIOR ART DOCUMENTS

Patent Documents

Patent Document 1: WO 2012/077617
Patent Document 2: Japanese Patent Application Laid Open Gazette No. 2015-072999

SUMMARY

Problem to be Solved by the Invention

In the trench gate type semiconductor device, an ON-state current flows along the side surface of the trench and is diffused from the side surface of the trench at a lower portion of the trench. For this reason, it is desirable that the current dispersion layer for reducing the ON-resistance should be disposed particularly around the trench. In the trench gate type silicon carbide semiconductor device disclosed in Japanese Patent Application Laid Open Gazette No. 2015-072999, however, the n-type current dispersion layer is entirety formed between the adjacent trenches. For this reason, the electric field inside the drift layer largely increases and as a result, there is a risk that the breakdown voltage in an OFF time may be reduced unnecessarily largely.

The present invention is intended to solve the above problem, and it is an object of the present invention to provide a silicon carbide semiconductor device capable of suppressing a reduction in the breakdown voltage while reducing an ON-resistance, and a power converter rising the same.

Means to Solve the Problem

The present invention is intended for a silicon carbide semiconductor device. According to the present invention, the silicon carbide semiconductor device has a drift layer, a body region, a source region, a gate insulating film, a gate electrode, a source electrode, a trench bottom protective layer, and a depletion suppressing layer. The drift layer is formed of silicon carbide and has a first conductivity type. The body region is provided on the drift layer and has a second conductivity type different from the first conductivity type. The source region is provided on the body region and has the first conductivity type. The gate insulating film is provided inside at least one gate trench reaching a position deeper than the body region and faces the body region and the source region. The gate electrode is provided inside the gate trench and faces the body region with the gate insulating film interposed therebetween. The source electrode is electrically connected to the source region. The trench bottom protective layer is provided on a bottom portion of the gate, trench and has the second conductivity type. The depletion suppressing layer is provided between a side surface of the gate trench and the drift layer, extends from a lower portion of the body region up to a position deeper than the bottom portion of the gate trench, has the first conductivity type, and has an impurity concentration of the first conductivity type higher than that of the drift layer. The impurity concentration of the first conductivity type of the depletion suppressing layer is reduced as the distance from the side surface of the gate trench becomes larger.

The present invention is also intended for a power converter. According to the present invention, the power converter has a main converter circuit, a drive circuit, and a control circuit. The main converter circuit has the above-described silicon carbide semiconductor device, and converts inputted electric power and outputs the electric power. The drive circuit outputs a drive signal which drives the silicon carbide semiconductor device to the silicon carbide semiconductor device. The control circuit outputs a control signal which controls the drive circuit to the drive circuit.

The present invention is still also intended for a method of manufacturing a silicon carbide semiconductor device. According to the present invention, the method of manufacturing a silicon carbide semiconductor device has the following steps. A semiconductor layer is formed, which includes a drift layer which is formed of silicon carbide and has a first conductivity type, a body region which is disposed on the drift layer and has a second conductivity type different from the first conductivity type, and a source region which is disposed on the body region and has the first conductivity type. At least one gate trench reaching a position deeper than the body region is formed in the semiconductor layer. A trench bottom protective layer having the second conductivity type is formed on a bottom portion of the gate trench. A depletion suppressing layer which extends from a lower portion of the body region up to a position deeper than the bottom portion of the gate trench, has the first conductivity type, and has an impurity concentration of the first conductivity type higher than that of the drift layer is formed between a side surface of the gate trench and the drift layer by ion implantation into the side surface of the gate trench. A gate insulating film which faces the body region and the source region is formed inside the gate trench. A gate electrode which faces the body region with the gate insulating film interposed them between is formed inside the gate trench. A source electrode which is electrically connected to the source region is formed.

The present invention is further intended for a method of manufacturing a power converter. According to the present invention, the method of manufacturing a power converter has the following steps. A silicon carbide semiconductor device is manufactured by the above-described method of manufacturing a silicon carbide semiconductor device. A main converter circuit which has the silicon carbide semiconductor device, and converts inputted electric power and outputs the electric power, a drive circuit which outputs a drive signal for driving the silicon carbide semiconductor device to the silicon carbide semiconductor device, and a control circuit which outputs a control signal for controlling the drive circuit to the drive circuit are formed.

Effects of the Invention

According to the silicon carbide semiconductor device of the present invention, an extension of a depletion layer from a region having the second conductivity type is suppressed by the depletion suppressing layer. This produces an effect of reducing an ON-resistance of the silicon carbide semiconductor device. Further, the impurity concentration of the first conductivity type of the depletion suppressing layer is reduced as the distance from the side surface of the gate trench becomes larger. It is thereby possible to suppress an increase in the electric field inside the drift layer due to the depletion suppressing layer while producing the above-described effect. Therefore, it is possible to suppress a reduction in the breakdown voltage. From the above, it is possible to suppress a reduction in the breakdown voltage while reducing the ON-resistance.

According to the power converter of the present invention, the main converter circuit has the silicon carbide semiconductor device. In the silicon carbide semiconductor device, an extension of a depletion layer from a region having the second conductivity type is suppressed by the depletion suppressing layer. This produces an effect of reducing an ON-resistance of the silicon carbide semiconductor device. Further, the impurity concentration of the first conductivity type of the depletion suppressing layer is reduced as the distance from the side surface of the gate trench becomes target. It is thereby possible to suppress an increase in the electric field inside the drift layer due to the depletion suppressing layer while producing the above-described effect. Therefore, it is possible to suppress a reduction in the breakdown voltage. From the above, it is possible to suppress a reduction in the breakdown voltage while reducing the ON resistance. Therefore, it is possible to increase the reliability of the power converter while reducing power loss.

According to the method of manufacturing a silicon carbide semiconductor device of the present invention, the depletion suppressing layer which suppresses an extension of a depletion layer from a region having the second conductivity type is formed. This produces an effect of reducing an ON-resistance of the silicon carbide semiconductor device. Further, the depletion suppressing layer is formed by ion implantation into the side surface of the gate trench. It is thereby possible to easily give such a concentration distribution as to be reduced as the distance from the side surface of the gate trench becomes larger, to the impurity concentration of the first conductivity type of the depletion suppressing layer. It is thereby possible to suppress an increase in the electric field inside the drift layer due to the depletion suppressing layer while producing the above-described effect of reducing the ON-resistance. Therefore, it is possible to suppress a reduction in the breakdown voltage. From the above, it is possible to suppress a reduction in the breakdown voltage while reducing the ON-resistance.

According to the method of manufacturing a power converter of the present invention, the main converter circuit having the silicon carbide semiconductor device is formed. In the method of manufacturing a silicon carbide semiconductor device, the depletion suppressing layer which suppresses an extension of a depletion layer from a region having the second conductivity type is formed. This produces an effect of reducing an ON-resistance of the silicon carbide semiconductor device. Further, the depletion suppressing layer is formed by ion implantation into the side surface of the gate trench. It is thereby possible to easily give such a concentration distribution as to be reduced as the distance from the side surface of the gate trench becomes larger, to the impurity concentration of the first conductivity type of the depletion suppressing layer. It is thereby possible to suppress an increase in the electric field inside the drift layer due to the depletion suppressing layer while producing the above-described effect of reducing the ON-resistance. Therefore, it is possible to suppress a reduction in the breakdown voltage. From the above, it is possible to suppress a reduction in the breakdown voltage while reducing the ON-resistance. Therefore, it is possible to increase the reliability of the power converter while reducing power loss.

These and other objects, features, aspects and advantages of the present invention will become more apparent from the following detailed description of the present invention when taken in conjunction with the accompanying drawings.

DESCRIPTION OF EMBODIMENT(S)

Hereinafter, with reference to attached figures, the preferred embodiments in accordance with the present invention will be described in detail. Further, the present invention is not limited to the following description, and may be changed as appropriate, without departing from the scope of the invention. Furthermore, in the following figures, for easy understanding, scales of constituent members are sometimes different from actual sizes. The same applies among the figures.

The First Preferred Embodiment

Structure

Figure 1:
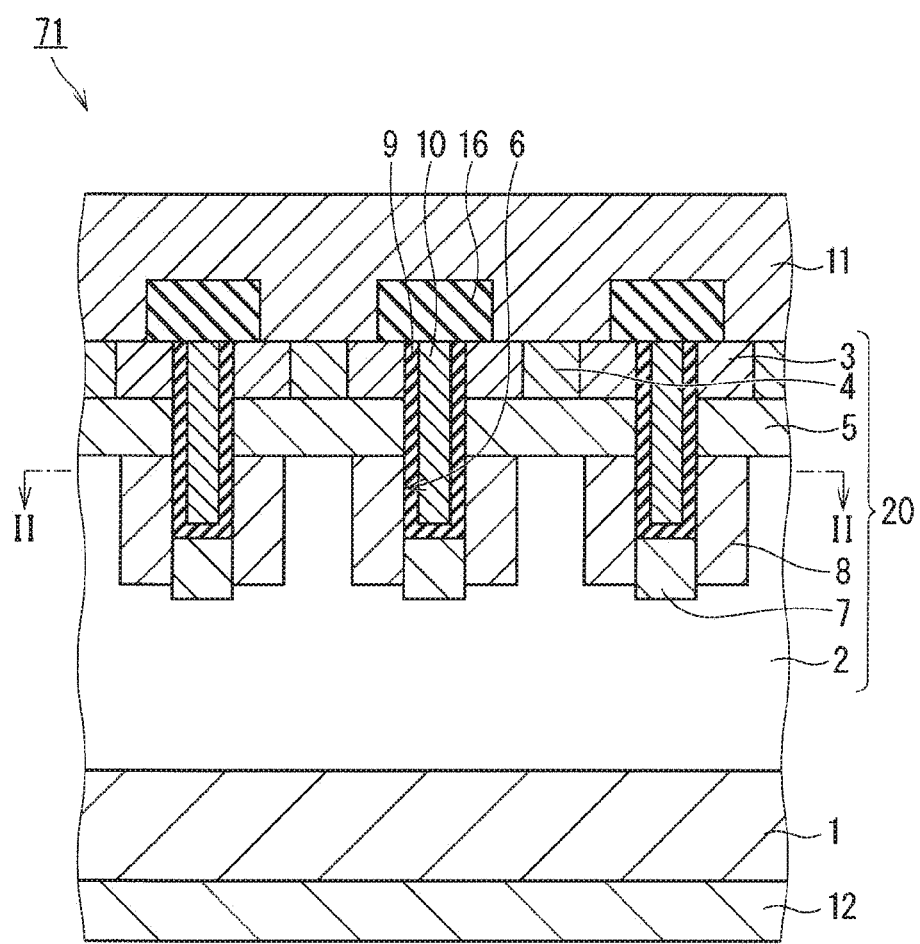
FIG. 1 is a view schematically showing a structure of a silicon carbide semiconductor device in accordance with a first preferred embodiment of the present invention and also a partial cross section along the line I-I of FIG. 2.
Figure 2:
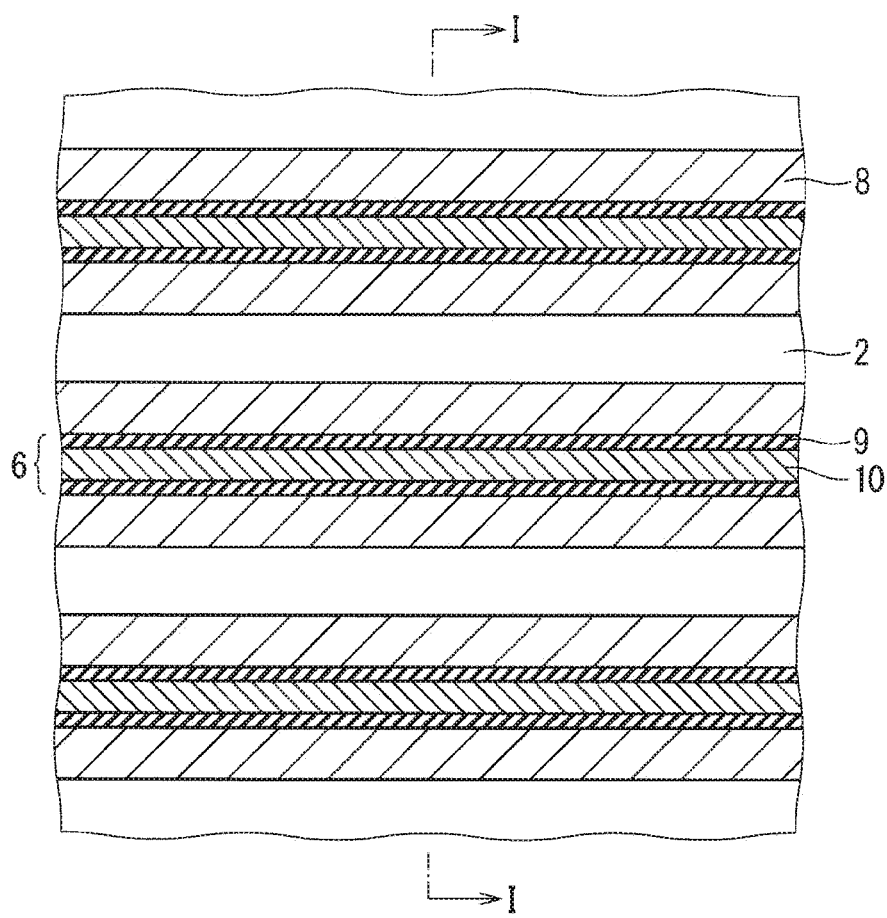
FIG. 2 is a partial cross section along the line II-II of FIG. 1 and also a view corresponding to a pattern layout of a gate trench and a depletion suppressing layer in a plan view.

FIG. 1 is a view schematically showing a structure of a MOSFET 71 in accordance with the first preferred embodiment of the present invention and also a partial cross section along the line I-I of FIG. 2. FIG. 2 is a partial cross section along the line II-II of FIG. 1 and also a view corresponding to a pattern layout of a gate trench 6 and a depletion suppressing layer is in a plan view. The cross section of FIG. 1 is a plane perpendicular to an extension direction of the gate trench 6 in a plan view (a horizontal direction in FIG. 2) and in FIG. 1, a horizontal direction corresponds to a width direction of the gate trench 6 and a vertical direction corresponds to a depth direction of the gate trench 6. In a cross section of FIG. 1, a plurality of gate trenches 6 are provided in the MOSFET 71.

The MOSFET 71 (silicon carbide semiconductor device) has a substrate 1, a silicon carbide layer 20 (semiconductor layer), a gate insulating film 9, a gate electrode 10, an interlayer insulating film 16, a source electrode 11, and, a drain electrode 12. The silicon carbide layer 20 has a drift layer 2, a source region 3, a body contact region 4, a body region 5, a trench bottom protective layer 7, and the depletion suppressing layer 8.

The substrate 1 is a silicon carbide substrate having an a type (a first conductivity type). The drain electrode 12 is provided on a lower surface of the substrate 1. In the present preferred embodiment, the drain electrode 12 is in ohmic contact with the lower surface of the substrate 1.

The silicon carbide layer 20 is provided on an upper surface of the substrate 1. Specifically, the silicon carbide layer 20 is epitaxially grown on the substrate 1 having a single crystal structure. The silicon carbide layer 20 has a lower surface facing the substrate 1 and an upper surface opposite to this lower surface. In the upper surface of the silicon carbide layer 20, the gate trench 6 is provided. The gate trench 6 has a side surface and a bottom portion. The bottom portion of the gate trench 6 forms a surface, and therefore this bottom portion will be sometimes referred to as a bottom surface hereinafter. The side surface of the gate trench 6 is typically in substantially parallel to a thickness direction of the silicon carbide layer 20 (the vertical direction in FIG. 1), but may be inclined.

The drift layer 2 is formed of silicon carbide. The drift layer 2 has an n type. The drift layer 2 has a donor concentration lower than that (an impurity concentration of the first conductivity type, herein an n-type impurity concentration) of the substrate 1.

The body region 5 is provided on the drift layer 2, and in the present preferred embodiment, provided directly on the drift layer 2. The body region 5 has a p type (a second conductivity type different from the first conductivity type).

The source region 3 is provided on the body region 5. The source region has an n type, and has a donor concentration higher than that of the drift layer 2. The source region 3 is isolated from the drift layer 2 by the body region 5. The body contact region 4 is provided on the body region 5. The body contact region 4 has a p type and has an acceptor concentration higher than that (an impurity concentration of the second conductivity type, herein a p-type impurity concentration) of the body region 5.

The silicon carbide layer 20 has the upper surface including the source region 3 and the body contact region 4. The interlayer insulating film 16 is provided on the upper surface of the silicon carbide layer 20. The interlayer insulating film 16 has a source contact hole. The source electrode 11 is disposed on the upper surface of the silicon carbide layer 20 on which the interlayer insulating film 16 is provided. The source electrode 11 is electrically connected to the source region 3 and the body contact region 4 through the source contact hole of the interlayer insulating film 16, and specifically is ohmically connected thereto.

The gate trench 6 penetrates the body region and reaches a position deeper than the body region 5. The side surface of the gate trench 6 faces the body region 5 and the source region 3.

The gate insulating film 9 is provided inside the gate trench 6 and faces the body region 5 and the source region 3. The gate electrode 10 is provided inside the gate trench 6 and faces the body region 5 with the gate insulating film 9 interposed therebetween.

The trench bottom protective layer 7 has a p type. The trench bottom protective layer 7 is provided on the bottom portion of the gate trench 6 and is in contact with the bottom portion of the gate trench 6. Thee trench bottom protective layer 7 has only to be provided on at least part of the bottom surface of the gate trench 6. The trench bottom protective layer 7 may be provided entirely on the bottom surface of the gate trench 6 as shown in FIG. 1, and this makes it possible to further reduce the electric field applied to the gate insulating film 9. The trench bottom protective layer 7 may have a width larger than that of the bottom surface of the gate trench 6 and may cover a corner portion formed of the bottom surface and the side surface of the gate trench 6.

The depletion suppressing layer 8 is in contact with the side surface of the gate trench 6 and the drift layer 2 and provided between the side surface of the gate trench 6 and the drift layer 2. Further, the depletion suppressing layer 8 is in contact with a lower portion of the body region 5 and extends from the lower portion of the body region 5 up to a position deeper than the bottom portion of the gate trench 6. Furthermore, the depletion suppressing layer 8 is in contact with a side surface of the trench bottom protective layer 7.

The depletion suppressing layer 8 has an n type. The depletion suppressing layer 8 has a donor concentration higher than that of the drift layer 2. Further, the donor concentration of the depletion suppressing layer 8 needs to be sufficiently high so as to prevent depletion layers extending from the adjacent trench bottom protective layers 7 from overlapping each other in an ON time of the MOSFET 71. Furthermore, in order to prevent an excessively high electric field from being applied to the bottom portion of the gate trench 6 when a high bias voltage is applied to the MOSFET 71, the donor concentration of the depletion suppressing layer 8 needs to not be excessively high. In view of these points, it is desirable that the donor concentration of the depletion suppressing layer 8 should be about twice to ten times the donor concentration of the drift layer, and specifically should be within a range from $1 \times 10^{15}$ cm$^{-3}$ to $1 \times 10^{18}$ cm$^{-3}$.

In order to prevent an excessively high electric field from being applied to the bottom portion of the gate trench 6 even when a high bias voltage is applied to the MOSFET 71, the width of the depletion suppressing layer 8 needs to not be excessively large. For example, it is desirable that the width of the depletion suppressing layer 8 should be within a range from 5% to 40% of a cell pitch. The depth of the depletion suppressing layer 8 needs to be selected so that a depletion layer extending from the trench bottom protective layer 7 in a plane direction may be suppressed in an ON time and the depletion layer may extend sufficiently into the drift layer 2, to thereby maintain the breakdown voltage in an OFF time. For this reason, it is desirable that the depletion suppressing layer 8 should be in contact with the side surface of the trench bottom protective layer 7 in a range from 0.1 μm to 1 μm in the depth direction. Further, in the present specification, the cell pitch corresponds to a distance between the centers of the adjacent gate trenches 6.

In FIG. 1, the gate trenches 6 include a pair of adjacent gate trenches 6 (for example, the gate trenches 6 on the right side and on the center in FIG. 1). The drift layer 2 has a portion extending from a side surface of the depletion suppressing layer 8 provided on one of the pair of gate trenches 6 up to a side surface of the depletion suppressing layer 8 provided on the other one of the pair of gate trenches 6. In other words, between the side surface of the depletion suppressing layer 8 provided on one of the pair of 6es 6 and the side surface of the depletion suppressing layer 8 provided on the other on the other one of the pair of gate trenches 6, an n-type portion other than the depletion suppressing layer 8 is disposed, and specifically the drift layer 2 is disposed.

Figure 3:
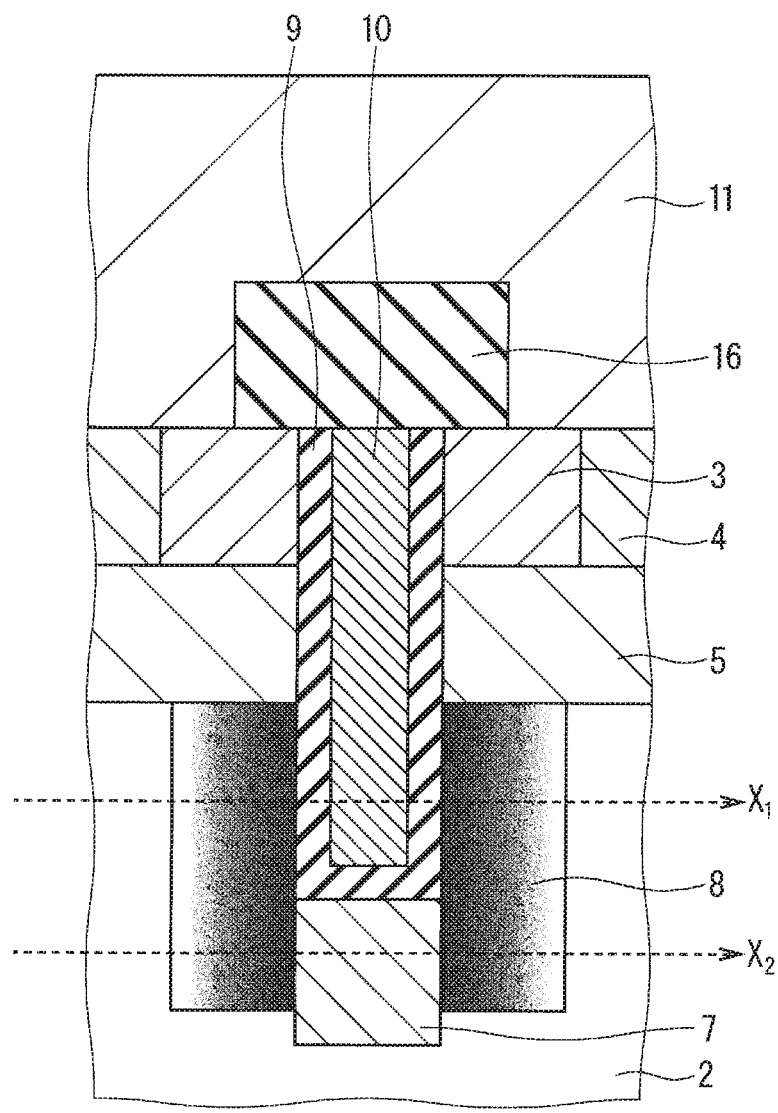
FIG. 3 is a partially enlarged view of the vicinity of the gate trench of FIG. 1 and also a view schematically showing a concentration distribution of an impurity of a first conductivity type of the depletion suppressing layer by gradation of tone.

FIG. 3 is a partially enlarged view of the vicinity of the gate trench 6 of FIG. 1 and also a view schematically showing a donor concentration distribution of the depletion suppressing layer 8 by gradation of tone. The donor concentration of the depletion suppressing layer 8 does not need to be uniform. In the present preferred embodiment, in a direction parallel to the bottom surface of the gate trench 6 (in the horizontal direction in FIG. 3) at the same depth from a surface of the silicon carbide layer 20, the donor concentration of the depletion suppressing layer 8 is reduced as the distance from the side surface of the gate trench 6 becomes larger. Herein, the above-described characteristic feature that "the donor concentration of the depletion suppressing layer 8 is reduced as the distance from the side surface of the gate trench 6 becomes larger" admits a region in which the impurity concentration is uniform to be included, and at least means that a region in which a concentration profile indicating a relation between the distance from the side surface of the gate trench 6 and the donor concentration decreases in monotone is included, as described later with reference to FIG. 4. In other words, a position at which the depletion suppressing layer 8 has the lowest donor concentration is located opposite to the side surface of the nearest adjacent gate trench 6 with respect to a position at which the depletion suppressing layer 8 has the highest donor concentration.

Such a distribution as described above, where the concentration becomes lower, may be achieved by forming the depletion suppressing layer 8 of a multilayer structure having an impurity concentration which becomes lower stepwise. Alternatively, the distribution may be achieved with the impurity concentration of the depletion suppressing layer 8 which becomes lower continuously.

Further, though the impurity concentration of the depletion suppressing layer 8 is uniform in the depth direction in FIG. 3, the impurity concentration of the depletion suppressing layer 8 does not need to be uniform in the depth direction.

Figure 4:
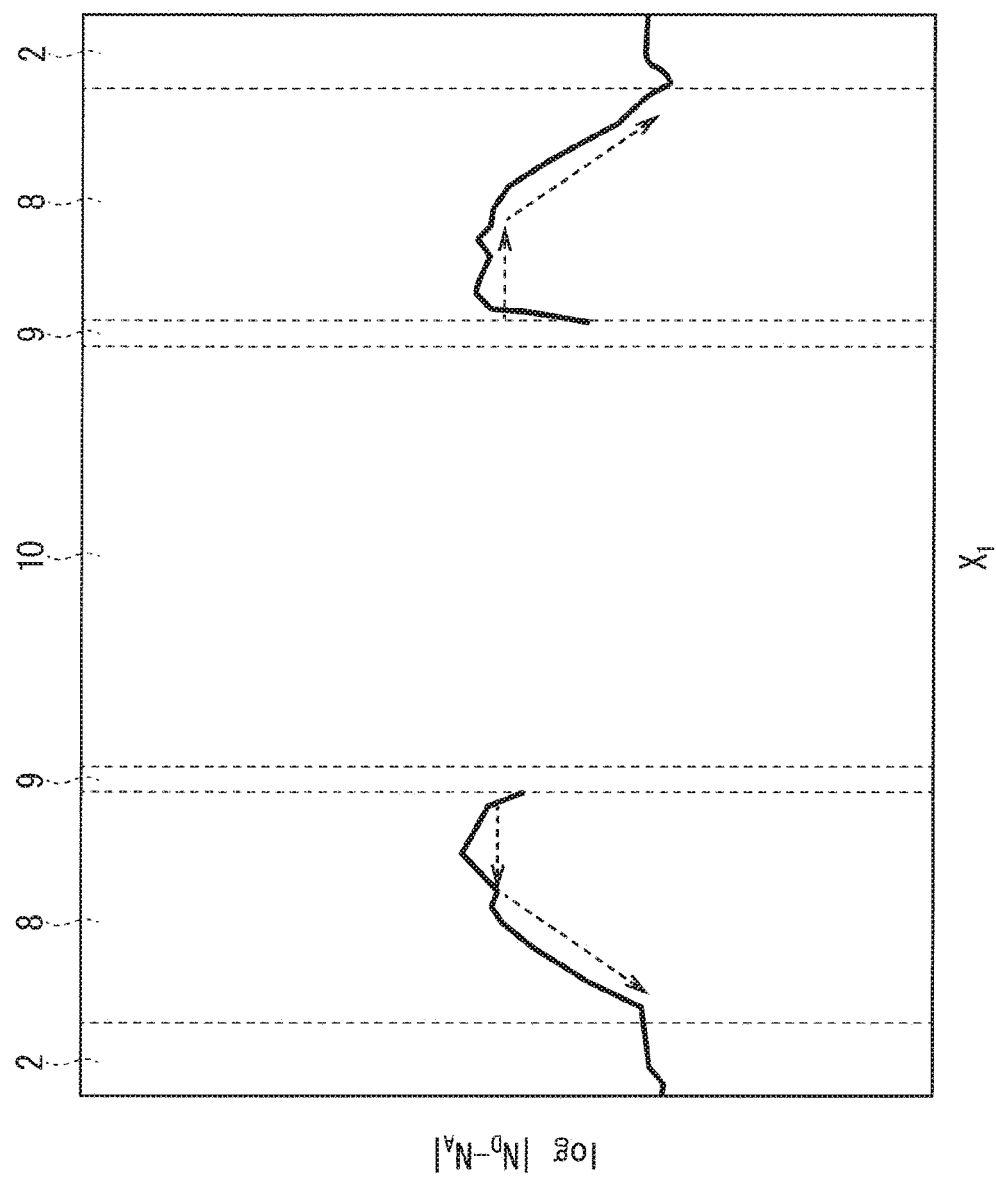
FIG. 4 is a graph showing a logarithmic value of effective impurity concentration along an axis X1 of FIG. 3 on the basis of a simulation result.
Figure 5:
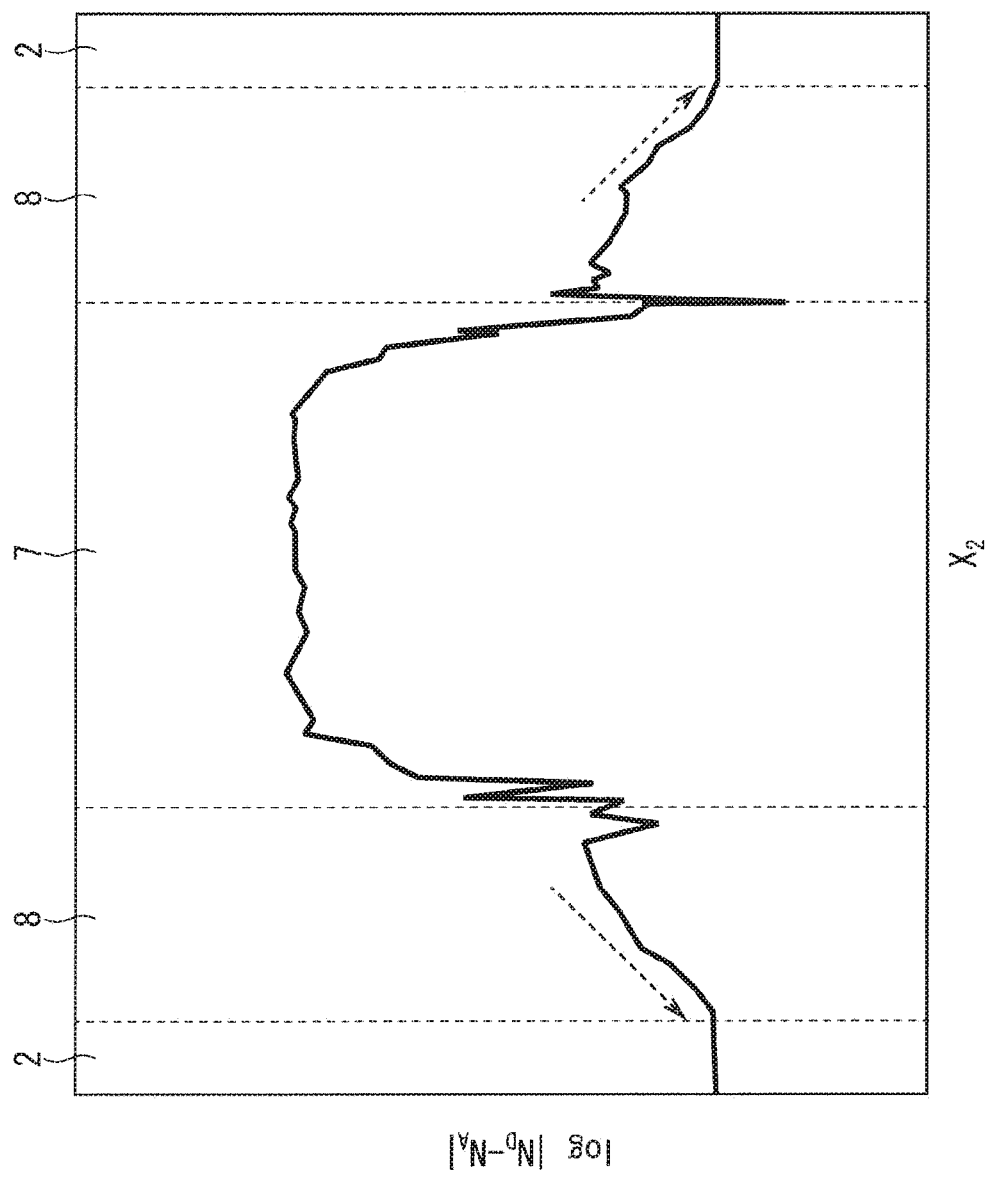
FIG. 5 is a graph showing a logarithmic value of effective impurity concentration along an axis X2 of FIG. 3 on the basis of a simulation result.

FIGS. 4 and 5 are graphs showing logarithmic values of effective impurity concentration along axes X1 and X2 of FIG. 3 on the basis of a simulation result, respectively. Herein, the "effective impurity concentration" is an absolute value of the difference between the donor concentration ND and the acceptor concentration NA. In these figures, as to the distribution of the effective impurity concentration, the solid line indicates the simulation result and the dashed arrow indicates a schematic distribution. Further, a fine variation of the solid line indicates a calculational error in the simulation, and as a concentration distribution on the design in an impurity addition step, for example, the distribution indicated by the dashed arrow may be used.

With reference to FIG. 4, the reference numeral above the graph indicates which of the drift layer 2, the depletion suppressing layer 8, the gate insulating film 9, and the gate electrode 10, each region on the axis X1 corresponds to. At a position along the axis X1, an acceptor impurity is not substantially added, and therefore the effective impurity concentration on the vertical axis substantially corresponds to the donor impurity concentration. As shown in this graph, the value of the donor concentration in the depletion suppressing layer 8 may partially have a region (see the dashed arrow in the horizontal direction in this graph) in which the concentration is almost uniform, but as an overall tendency, the concentration is reduced as the distance from the side surface of the gate trench 6 becomes larger (see the dashed arrow in the diagonal direction in this graph).

With reference to FIG. 5, the reference numeral above the graph indicates which of the drift layer 2, the depletion suppressing layer 8, and the trench bottom protective layer 7, each region on the axis X2 corresponds to. At a position along the axis X2, the acceptor impurity is added in the trench bottom protective layer 7 and a portion in the vicinity thereof, and since the conductivity type is reversed at the boundary between the trench bottom protective layer 7 and the depletion suppressing layer 8, it can be seen that the effective impurity concentration sharply falls in the vicinity of this boundary. In the other portion, the acceptor impurity is not substantially added, and therefore the effective impurity concentration on the vertical axis substantially corresponds to the donor impurity concentration. The value of the donor concentration in the depletion suppressing layer 8 may partially have a region in which the concentration is almost uniform, but as an overall tendency, the concentration is reduced as the distance from the side surface of the gate trench 6 becomes larger (see the dashed arrow in the diagonal direction in this graph).

Further, with reference to FIG. 2; in the present preferred embodiment, the cell structure of the MOSFET 71 has a stripe shape. In other words, the gate trenches 6 are provided in stripes. Further, a pattern layout of the trench bottom protective layer 7 (FIG. 1) may be the same as that of the gate trench 6, though the width thereof may be different. Furthermore, the depletion suppressing layers 8 are so provided in stripes as to sandwich the gate trench 6. Further, a pattern layout of the source region 3 (FIG. 1) may be the same as that of the depletion suppressing layer 8, though the width thereof may be different.

Manufacturing Method

FIGS. 6 to 11 are partial cross sections schematically showing the first to sixth steps in one exemplary method of manufacturing the MOSFET 71 (FIG. 1). The visual field of these cross sections corresponds to that of FIG. 1. Hereinafter, with reference to these figures, the manufacturing method will be described. Further, materials taken as examples in the following description may be changed to other materials having the same functions as appropriate.

Figure 6:
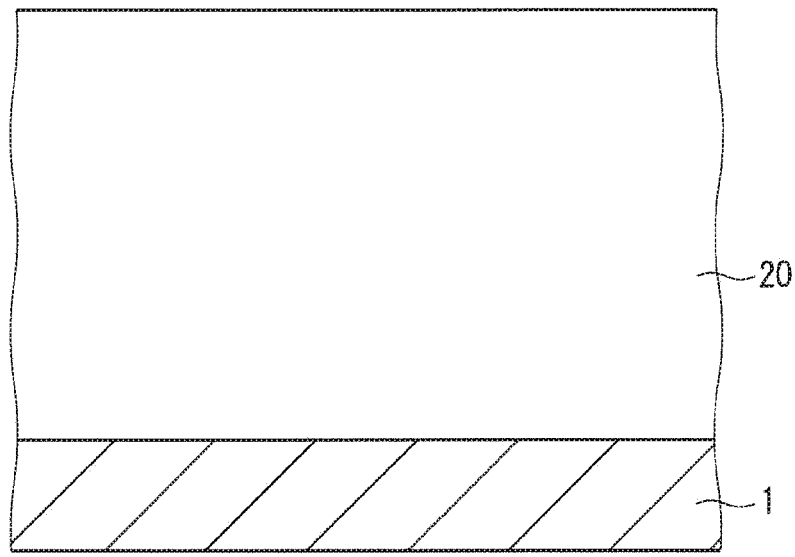
FIG. 6 is a partial cross section schematically showing a first step of a method of manufacturing the silicon carbide semiconductor device of FIG. 1.

With reference to FIG. 6, on the substrate 1, the n-type silicon carbide layer 20 is formed by epitaxial growth. The donor concentration of the silicon carbide layer 20 (the drift layer 2) is $1\times10^{14}$ cm$^{-3}$ to $1\times10^{17}$ cm$^{-3}$. Further, part of the silicon carbide layer 20 becomes the drift layer 2 (FIG. 1).

Figure 7:
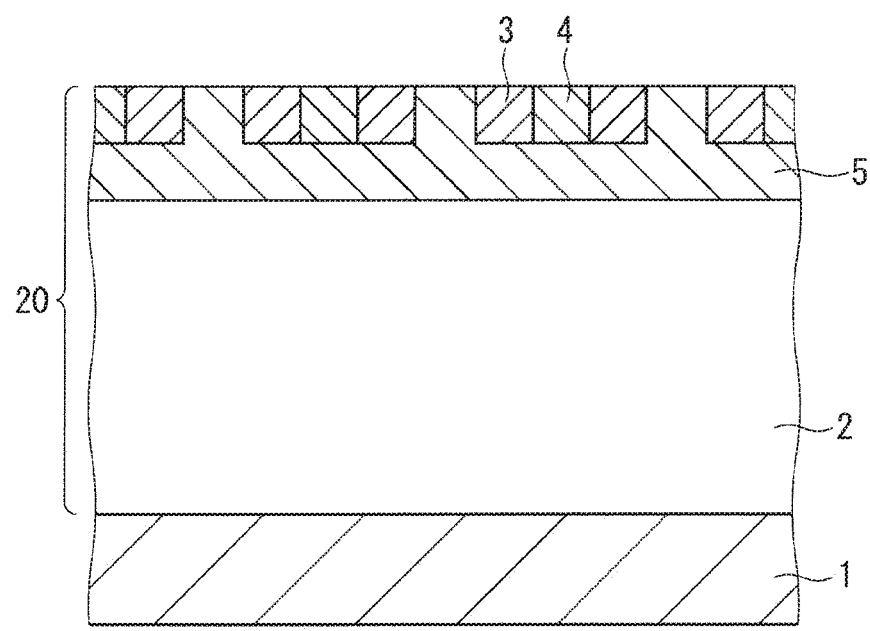
FIG. 7 is a partial cross section schematically showing a second step of the method of manufacturing the silicon carbide semiconductor device of FIG. 1.

With reference to FIG. 7, in the upper surface of the silicon carbide layer 20, the source region 3, the body contact region 4, and the body region 5 are formed by using ion implantation or epitaxial growth. These regions may be formed in any order. The donor concentration of the source region 3 is $1\times10^{18}$ cm$^{-3}$ to $1\times10^{20}$ cm$^{-3}$, and the acceptor concentration of the body contact region 4 is $1\times10^{19}$ cm$^{-3}$ to $1\times10^{21}$ cm$^{-3}$. It is preferable that the acceptor concentration of the body region 5 should be in a range from $1\times10^{14}$ cm$^{-3}$ to $1\times10^{18}$ cm$^{-3}$, and the concentration and the thickness thereof may not be uniform. A portion below the body region 5 in the silicon carbide layer 20 becomes the drift layer 2. Thus, the silicon carbide layer 20 including the drift layer 2, the body region 5, the source region 3, and the body contact region 4 is formed.

Figure 8:
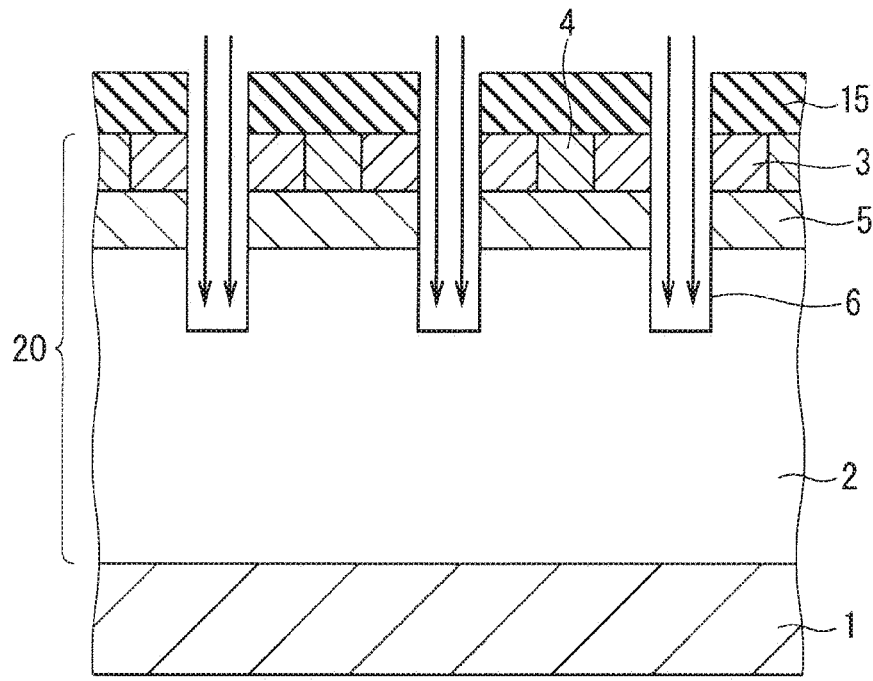
FIG. 8 is a partial cross section schematically showing a third step of the method of manufacturing the silicon carbide semiconductor device of FIG. 1.

With reference to FIG. 8, on the silicon carbide layer 20, the gate trench 6 penetrating the source region 3 and the body region 5 is formed by etching. Specifically, on the silicon carbide layer 20, first, a silicon oxide film 15 having a thickness of 1 μm to 2 μm is deposited. Next, the silicon oxide film 15 is patterned by the photolithography technique and the reactive ion etching (RIE) process. By performing reactive ion etching with the patterned silicon oxide film 15 as an etching mask, the gate trench 6 is formed. The depth of the gate bench 6 is deeper than that of the body region 5, and is 1.0 μm to 6.0 μm.

Figure 9:
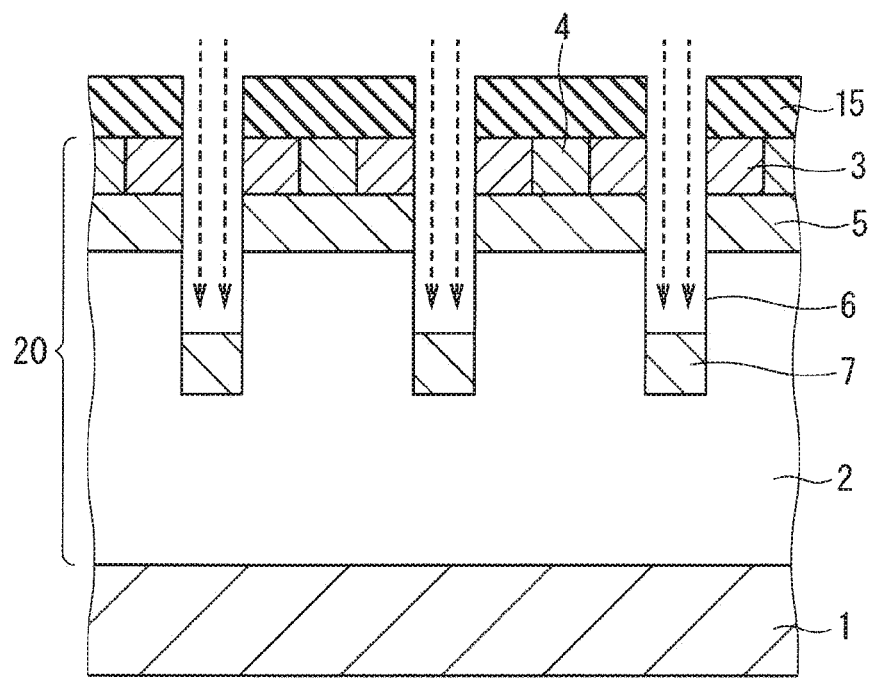
FIG. 9 is a partial cross section schematically showing a fourth step of the method of manufacturing the silicon carbide semiconductor device of FIG. 1.

With reference to FIG. 9, on the bottom portion of the gate trench 6, the trench bottom protective layer 7 having a p type is formed. Specifically, as indicated by the dashed line, by using the silicon oxide film 15 as an implantation mask, the ion implantation of acceptor is performed. The direction of an ion beam used in the ion implantation may be substantially in parallel to the thickness direction of the silicon carbide layer 20 (in other words, the depth direction of the gate trench 6). Further, as the implantation mask, something other than the silicon oxide film 15 may be formed. Furthermore, the trench bottom protective layer 7 may be formed by epitaxial growth, instead of ion implantation. Specifically, after the gate trench 6 is formed deeper, corresponding to the thickness of the trench bottom protective layer 7, the trench bottom protective layer 7 may be formed by epitaxial growth inside the gate trench 6. Alternatively, the trench bottom protective layer 7 may be formed in advance before the gate trench 6 is formed. In that case, the gate trench 6 is formed by etching the silicon carbide layer 20 on the trench bottom protective layer 7. Preferably, the acceptor concentration of the trench bottom protective layer 7 is in a range from $1\times10^{17}$ cm$^{-3}$ to $1\times10^{19}$ cm$^{-3}$, and the thickness thereof is in a range from 0.1 μm to 2.0 μm. The trench bottom protective layer 7 may have a concentration distribution in the depth direction. Further, the trench bottom protective layer 7 may have portions having different thicknesses. The trench bottom protective layer 7 may cover the corner of the bottom portion of the gate trench 6, or the trench bottom protective layer 7 may be in contact with only the bottom portion of the gate trench 6 and out of contact with the corner.

Figure 10:
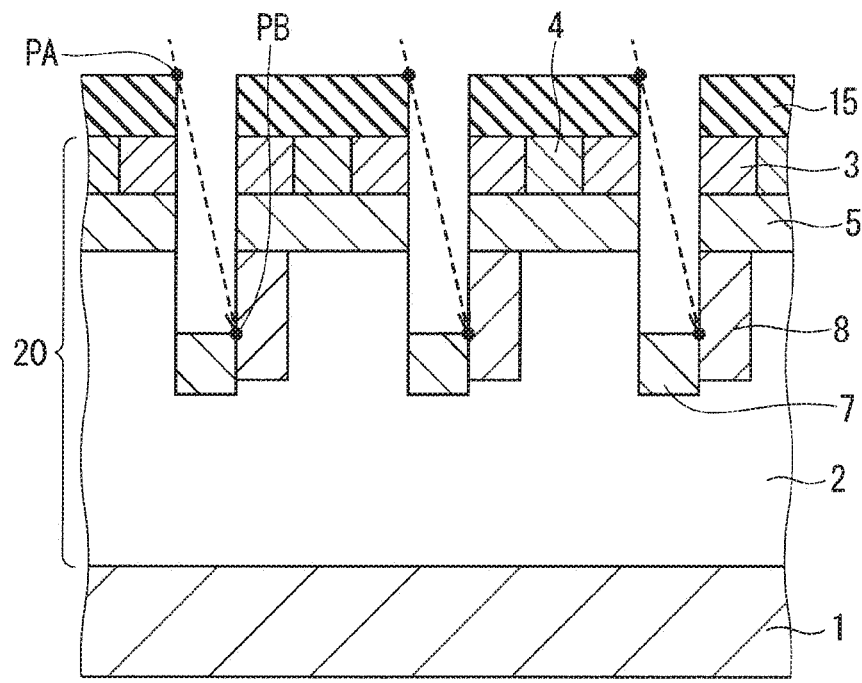
FIG. 10 is a partial cross section schematically showing a fifth step of the method of manufacturing the silicon carbide semiconductor device of FIG. 1.
Figure 11:
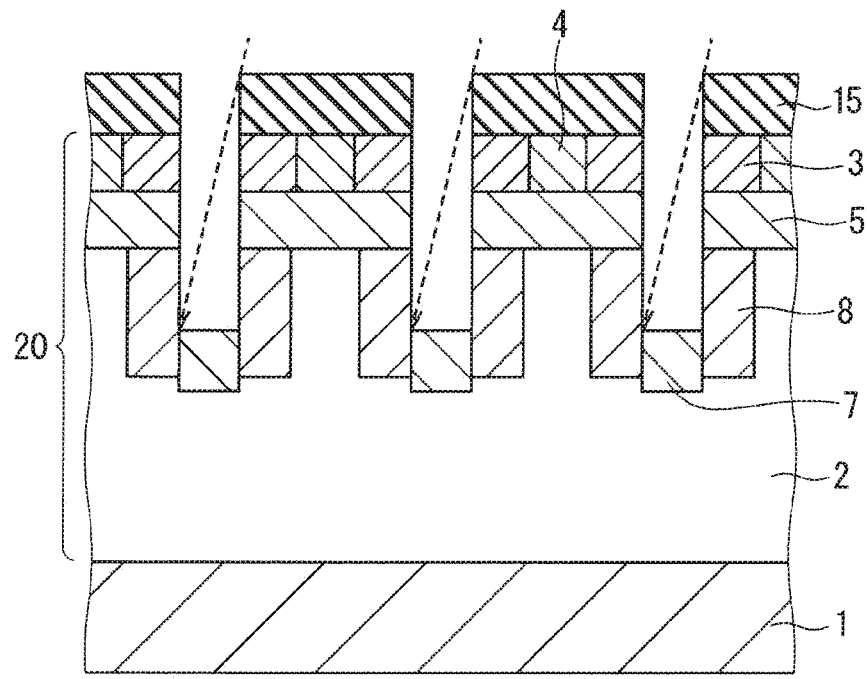
FIG. 11 is a partial cross section schematically showing a sixth step of the method of manufacturing the silicon carbide semiconductor device of FIG. 1.

With reference to FIGS. 10 and 11, the depletion suppressing layers 8 are formed between the side surfaces of the gate trench 6 and the drift layer 2 by ion implantation to a right side surface and a left side surface of the gate trench 6. This ion implantation is performed so that the donor concentration of the depletion suppressing layer 8 may be reduced as the distance from the side surface of the gate trench 6 becomes larger. Such a concentration distribution can be easily achieved by controlling the energy of the ion implantation. Hereinafter, this process will be described in detail.

As shown in these figures, the step of forming the depletion suppressing, layer 8 includes a step of emitting an oblique ion beam (indicated by the dashed arrow in these figures) to the thickness direction of the silicon carbide layer 20 (the vertical direction in these figures). Specifically, when the ion beam is emitted from above, the substrate 1 is inclined so that the side surface of the gate trench 6 may face upward to some degree. The ion beam can thereby reach the side surface of the gate trench 6. It is therefore possible to implant an impurity into the side surface of the gate trench 6.

At that time, it is desirable that the tilt angle of the substrate 1 should be selected so that the impurity may be implanted up to the corner of the bottom portion of the gate trench 6, in other words, that the impurity may be implanted into the silicon carbide layer 20 from not only the side surface of the gate trench 6 but also part of the bottom surface of the gate trench 6. It is thereby possible to form the depletion suppressing layer 8 up to a deeper position on the side surface of the trench bottom protective layer 7. Specifically, in a cross section of FIG. 10, it is desirable that the ion implantation should be performed at a tilt angle in a range of ±15 degrees with an angle along a straight line connecting an upper end (point PA in FIG. 10) of a sidewall of the gate trench 6 including a sidewall of the implantation mask and a lower end (point PB in FIG. 10) of a sidewall opposite to the above sidewall as a center.

The above tilt angle does not need to be constant, and the ion implantation may be performed at a plurality of times at a plurality of different angles with respect to one side surface. Preferably, the step of forming the depletion suppressing layer 8 includes step of emitting the ion beam at a first ion beam angle (an angle shallower than that indicated by the dashed arrow of FIG. 10) where only a region of the side surface of the gate trench 6, which is away from the bottom portion of the gate trench 6, is exposed to the ion beam and another step of emitting the ion beam at a second ion beam angle (an angle deeper than that indicated by the dashed arrow of FIG. 10) where a region including the bottom portion and the side surface of the gate trench 6 is exposed to the ion beam. More preferably, assuming that an ion beam angle at which a boundary between the side surface and the bottom portion of the gate trench 6 is exposed to the ion beam and the bottom portion of the gate trench 6 is not exposed to the ion beam, in other words, an angle indicated by the dashed arrow of FIG. 10, is a third ion beam angle, the difference between the third ion beam angle and each of the first ion beam angle and the second ion beam angle is within 15 degrees.

Herein, in FIGS. 10 and 11, the shape of the depletion suppressing layer 8 is schematically shown. As described above, when the depletion suppressing layer 8 is formed by oblique ion implantation, strictly speaking, a bottom surface and a side surface of the depletion suppressing layer 8 are not in parallel to the bottom surface and the side surface of the gate trench 6, respectively.

Further, when the ion implantation is performed, the substrate 1 may be not only tilted as described above but also rotated in an inplane direction of the substrate 1. In the above-described impurity implantation for forming the depletion suppressing layer 8, the impurity may be also implanted from the side surface of the gate trench 6, which is adjacent to the body region 5, and the bottom surface of the gate trench 6, which is adjacent to the trench bottom protective layer 7. In other words, the donor may be partially implanted into a region overlapping with the body region 5 and the trench bottom protective layer 7. The amount of donor impurities to be implanted into such an overlapping region, however, is so suppressed as not to reverse the conductivity type.

After the ion implantation, the silicon oxide film 15 is removed. Further, after the silicon oxide film 15 is removed, the ion implantation may be performed again. Alternatively, the silicon oxide film 15 may be removed before the first ion implantation for forming the depletion suppressing layer 8. In order to perform the ion implantation into only an active region of the MOSFET 71, the implantation mask having a pattern in which only the active region is opened may be formed by using photolithography. Further, the depletion suppressing layer 8 may be formed before the trench bottom protective layer 7 is formed.

Subsequently, in the above-described step, the impurity added by ion implantation is activated. Specifically, annealing is performed by using a heat treatment apparatus. This annealing is performed in an inert gas atmosphere such as argon (Ar) gas or the like or a vacuum at 1300° C. to 1900° C. for 30 seconds to one hour.

With reference back to FIG. 1, the gate insulating film 9 and the gate electrode 10 are formed inside the gate trench 6. Specifically, first, the gate insulating film 9 and the gate electrode 10 are entirely formed. After that, by patterning or etchback, the gate insulating film 9 and the gate electrode 10 can be left only inside the gate trench 6.

Further, though the film thickness (the size in the vertical direction in this figure) of the gate insulating film 9 on a position corresponding to a bottom portion of the gate electrode 10 is almost the same as that (the size in the horizontal direction in this figure) of the gate insulating film 9 on a position corresponding to a side surface of the gate electrode 10 in FIG. 1, the film thickness of the gate insulating film 9 on the position corresponding to the bottom portion of the gate electrode 10 may be larger than that of the gate insulating film 9 on the position corresponding to the side surface of the gate electrode 10. Only a portion corresponding to the side surface of the gate electrode 10 is directly involved in a switching operation of the MOSFET 71, i.e., a control over application of an electric field to a channel region by the gate electrode 10, but a portion corresponding to the bottom portion of the gate electrode 10 is not directly involved in that operation. Therefore, the film thickness of the gate insulating film 9 on the portion corresponding to the bottom portion of the gate electrode 10 does not have any direct effect on a threshold voltage of the MOSFET 71, and can be made larger as necessary. As described earlier, at the bottom portion of the gate trench 6, a dielectric breakdown easily occurs due to an electric field concentration. By selectively increasing the film thickness of the gate insulating film 9 on the portion corresponding to the bottom portion of the gate electrode 10, as described above, it is possible to further suppress occurrence of the dielectric breakdown of the gate insulating film 9.

Subsequently, on an entire surface of the silicon carbide layer 20 in which the gate insulating film 9 and the gate electrode 10 are provided as described above, the interlayer insulating film 16 is formed. Next, by patterning the interlayer insulating film 16, formed is the source contact hole reaching the some region 3 and the body contact region 4.

Subsequently, the source electrode 11 is so formed as to come into contact with an upper portion of the source region 3 and an upper portion of the body contact region 4. The source electrode 11 needs to be in ohmic contact with the source region 3 and the body contact region 4. As a suitable forming method, for example, first, on an entirely surface of the interlayer insulating film 16 including the source contact hole, a metal film which is mainly formed of Ni is formed. Next, by reacting the metal film with the silicon carbide layer 20 by heat treatment at 600° C. to 1100° C. silicide film which becomes an ohmic electrode is formed. After that, the unreacted metal film remaining on the interlayer insulating film 16 is removed by wet etching. After that, the heat treatment may be performed again. By performing this heat treatment at a temperature higher than that in the foregoing heat treatment, formed is an ohmic contact having a lower contact resistance. Further, by depositing an electrode material such as an aluminum (Al) alloy or the like, the source electrode 11 is formed on the interlayer insulating film 16 and on the source contact hole.

Finally, the drain electrode 12 is formed on a back surface of the substrate 1 by using the Al alloy or the like. Thus, the MOSFET 71 having such a cell structure as shown in FIG. 1 is manufactured.

Comparative Example

Figure 12:
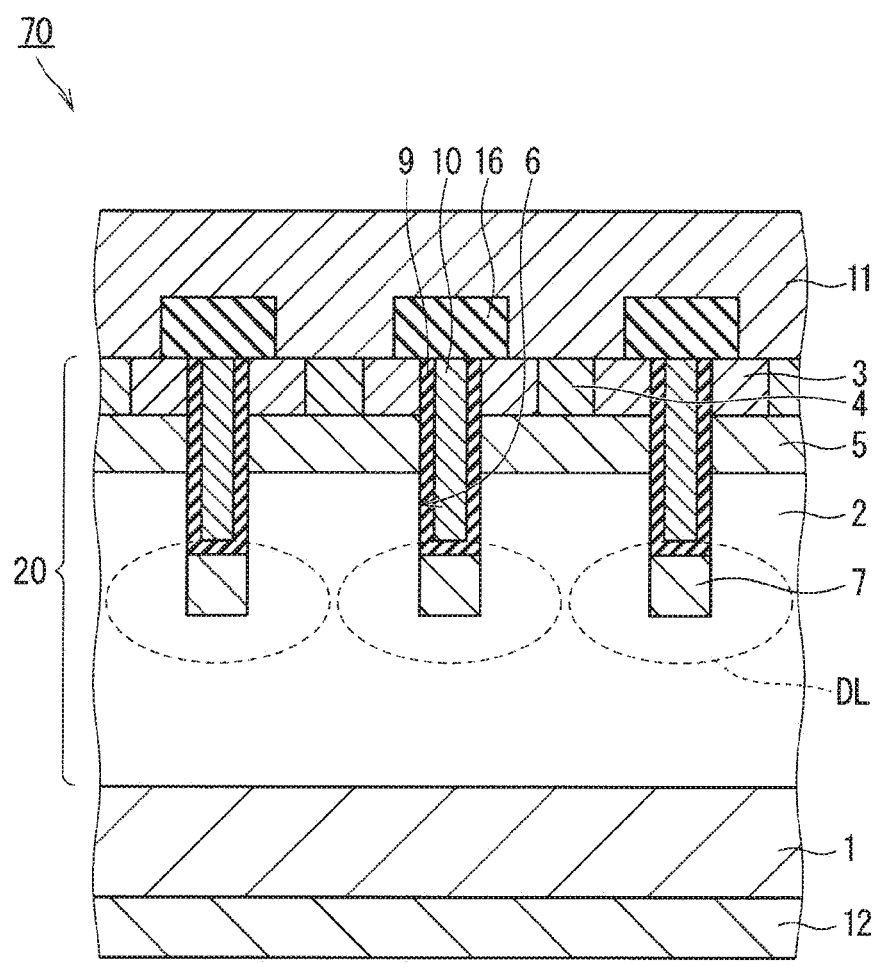
FIG. 12 is a partial cross section schematically showing an extension of a depletion layer of a silicon carbide semiconductor device in an ON state in a Comparative Example.
Figure 13:
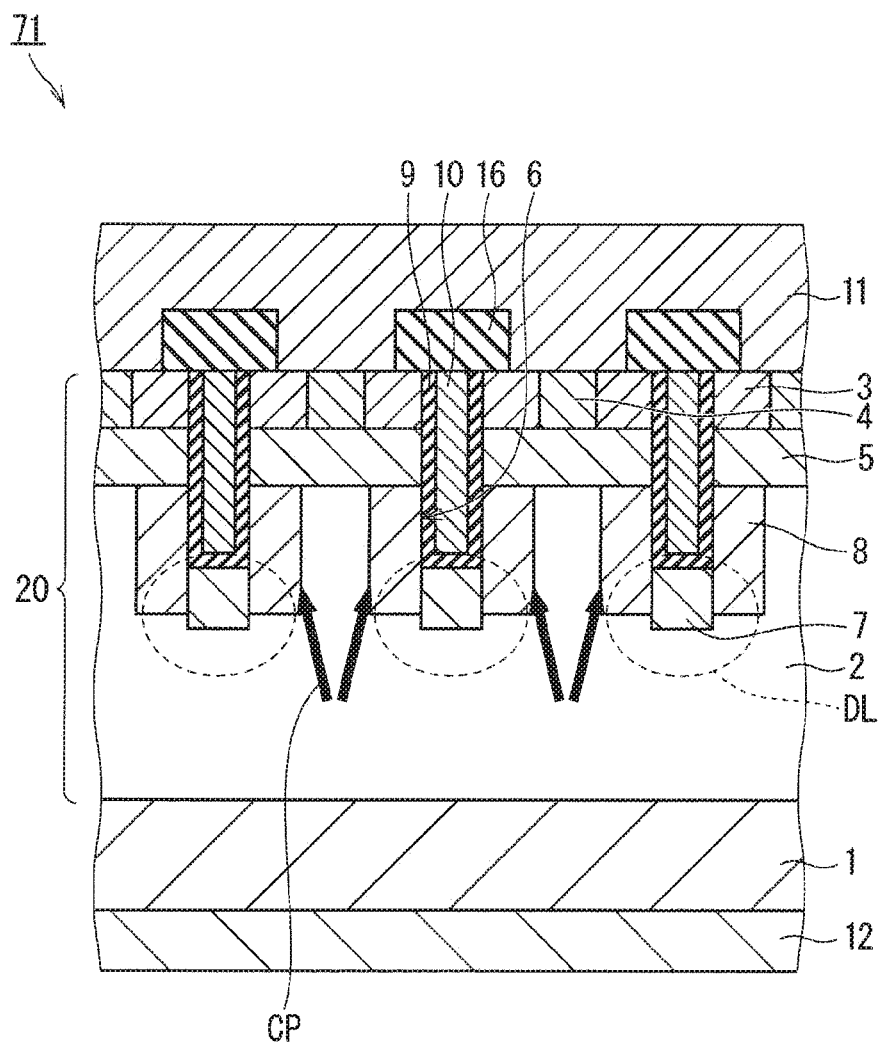
FIG. 13 is a partial cross section schematically showing an extension of a depletion layer of a silicon carbide semiconductor device in an ON state in an Example.

FIGS. 12 and 13 are partial cross sections schematically showing an extension of a depletion layer DL of a MOSFET 70 in a Comparative Example and that of the MOSFET 71 in the present preferred embodiment in an ON state, respectively. The MOSFET 70 in the Comparative Example does not have the depletion suppressing layer 8 (FIG. 13).

With reference to FIG. 12, in the MOSFET 70 of the Comparative Example, due to an effect of the depletion layer DL extending from the trench bottom protective layer 7, a JFET region is formed between the adjacent trench bottom protective layers 7. This narrows an ON-state current path, to thereby generate a JFET resistance.

With reference to FIG. 13, also in the MOSFET 71 of the present preferred embodiment, the above-described narrowing occurs to some degree. Since the depletion suppressing layer 8 having the donor concentration higher than that of the drift layer 2 is provided, however, the extension of the depletion layer DL is suppressed. This alleviates the narrowing of the ON-state current path, to thereby reduce the JFET resistance. Further, since the ON-state current path is expanded thus, even when a smaller cell pitch is used, the increase of the JFET resistance has little effect. This can increase channel width density. It is thereby possible to further reduce the ON-resistance. Furthermore, since the distance between the trench bottom protective layers 7 becomes smaller due to the reduction in the cell pitch, it is possible to alleviate the electric field to be applied to the bottom portion of the gate trench 6. This increases the breakdown voltage and the reliability of the gate insulating film 9.

Simulation Result

Figure 14:
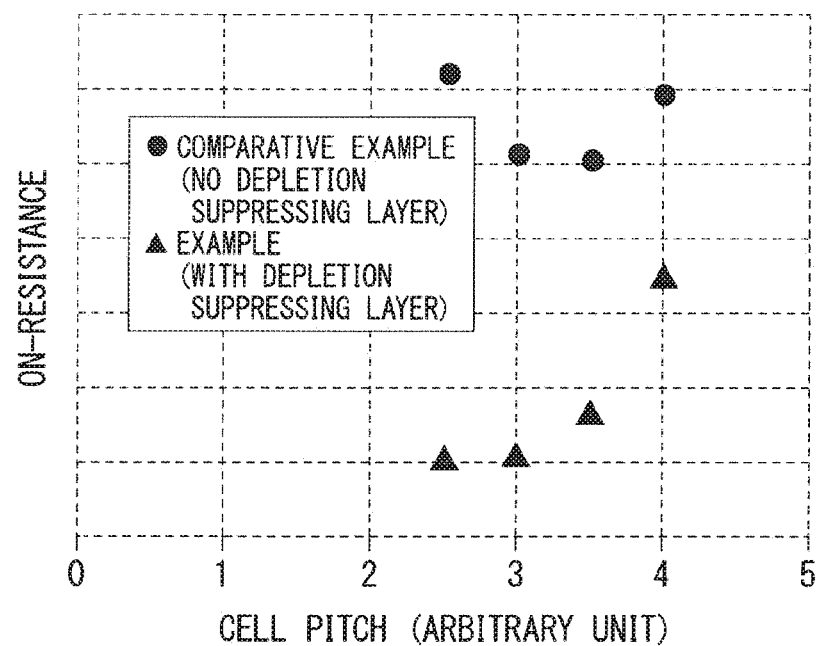
FIG. 14 is a graph showing a relation between a cell pitch and an ON-resistance in each of the Comparative Example and the Example on the basis of a simulation result.

FIG. 14 is a graph showing a relation between a cell pitch and an ON-resistance in each of the above-described Comparative Example (plot of circle) and the Example of the present preferred embodiment (plot of triangle) on the basis of a simulation result. The Example has an ON-resistance lower than that of the Comparative Example. It can be thought that the reason is that the depletion suppressing layer 8 suppresses the expansion of the JFET region as described above. Further, it can be seen that by reducing the cell pitch from the value of "4" to the value of about "3", the effect of reducing the ON-resistance is further increased. Furthermore, even when the cell pitch is further reduced to the value of "2.5", an increase in the ON-resistance is avoided.

Figure 15:
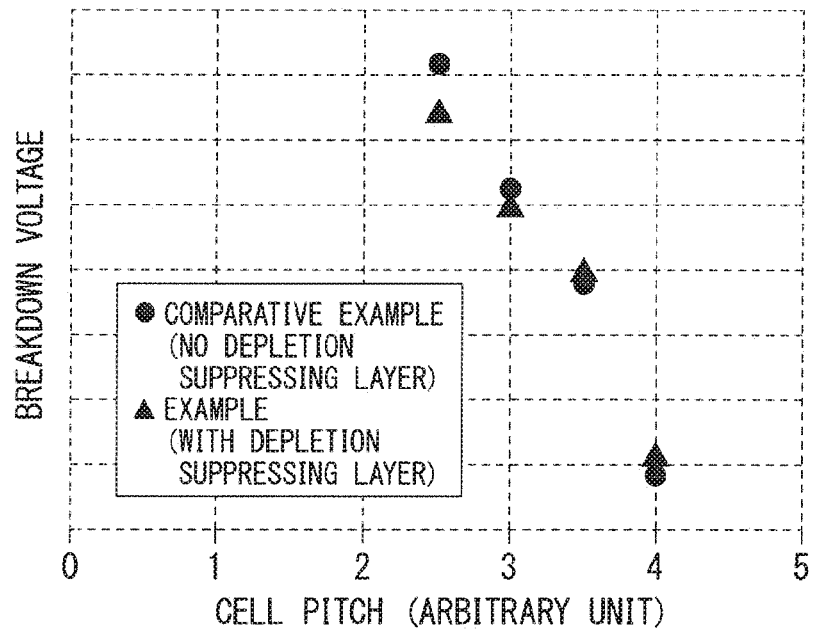
FIG. 15 is a graph showing a relation between a cell pitch and an breakdown voltage in each of the Comparative Example and the Example on the basis of a simulation result.

FIG. 15 is a graph showing a relation between a cell pitch and a breakdown voltage in each of the above-described Comparative Example (plot of circle) and the above-described Example (plot of triangle) on the basis of a simulation result. From this result, it can be seen that if some degree of cell pitch (for example, the value of about "3" or more) is ensured, the breakdown voltage hardly depends on whether the depletion suppressing layer 8 is provided or not. Considering this result together with the above-described simulation result on the ON-resistance, by reducing the cell pitch within a range where the breakdown voltage is not reduced, it is possible to increase the channel width density and alleviate the electric field to be applied to the bottom portion of the gate trench 6. Therefore, according to the Example, it is possible to achieve the ON-resistance lower than that in the Comparative Example having the same breakdown voltage. It is thereby possible to improve the trade-off between the breakdown voltage and the ON-resistance.

On the other hand, as can be seen from FIG. 15, even if the drift layer 2 is interposed between the depletion suppressing layers 8, when the cell pitch is too short (for example, the value of "2.5"), the breakdown voltage is disadvantageously reduced by providing the depletion suppressing layer 8. If the depletion suppressing layer 8 is formed not only partially between the gate trenches 6 but also entirely, it can be easily presumed that the breakdown voltage may be further reduced. Since the drift layer 2 is interposed between the depletion suppressing layers 8 and the donor concentration of the depletion suppressing layer 8 is reduced as the distance from the gate trench 6 becomes larger in the present preferred embodiment, it is possible to suppress the extension of depletion layer from the trench bottom protective layer 7 while suppressing an increase in the electric field inside the silicon carbide layer 20. As a result, it is possible to reduce the ON-resistance while suppress the reduction in the breakdown voltage.

Further, though the p-type trench bottom protective layer 7 is provided on the bottom portion of the gate trench 6 in the present preferred embodiment, a structure in which a p-type protective layer is further provided between the adjacent gate trenches 6 is not used. Such a structure, however, may be used as necessary. In such a structure, it is desirable that the drift layer 2 should be interposed between the p-type protective layer provided in the center portion between the gate trenches 6 and the depletion suppressing layer 8. This can suppress an increase in the electric field generated by providing the depletion suppressing layer 8. In this case, however, it is necessary to set the cell pitch in consideration of the narrowing of the ON-state current path due to the depletion layer extending from the above-described p-type protective layer. For this reason, from the viewpoint of the reduction in the cell pitch, the structure in the present preferred embodiment where the above-described p-type protective layer is not provided is more desirable.

Thus, by providing the depletion suppressing layer 8, it is possible to reduce the ON-resistance. Further, by disposing the depletion suppressing layer 8 away from the center portion between the gate trenches 6, the electric field in an OFF time is alleviated and therefore the breakdown voltage increases. Furthermore, the cell pitch can be reduced and it becomes possible to increase the channel width density and alleviate the electric field on the bottom portion of the gate trench 6. These effects make it possible to reduce the ON-resistance and increase the breakdown voltage. In other words, it is possible to improve the trade-off between the on characteristics and the Off characteristics of the MOSFET.

Summary of Effects

According to the MOSFET 71 of the first preferred embodiment, the extension of the depletion layer from the region having a p type is suppressed by the depletion suppressing layer 8. This produces an effect of reducing the ON-resistance of the MOSFET 71. Further, the donor concentration of the depletion suppressing layer 8 is reduced as the distance from the side surface of the gate trench 6 becomes larger. It is thereby possible to suppress an increase in the electric field inside the drift layer 2 due to the depletion suppressing layer 8 while producing the above-described effect. Therefore, the reduction in the breakdown voltage can be suppressed. From the above, it is possible to suppress the reduction in the breakdown voltage while reducing the ON-resistance.

The drift layer 2 has a portion extending from the side surface of the depletion suppressing layer 8 provided on one of a pair of adjacent gate trenches 6 up to the side surface of the depletion suppressing layer 8 provided on the other one of the pair of gate trenches 6. The electric field inside the silicon carbide layer 20 can be further alleviated, as compared with a case where there is an n-type region having an impurity concentration higher than that of the drill layer 2 between the above-described side surfaces. Therefore, the reduction in the breakdown voltage can be further suppressed. Further, unlike in the case where the p-type region is provided between the above-described side surfaces (for example, in the case of using the above-described technique disclosed in Japanese Patent Application Laid Open Gazette No. 2015-072999), the narrowing of the ON-state current path due to the depletion layer extending from the region can be avoided. Therefore, it is possible to further reduce the ON-resistance.

Since the extension of the depletion layer is suppressed as described above, it is possible to form the gate trenches 6 more densely without largely increasing the JFET resistance. Since this makes it possible to increase the channel width density, the ON-resistance can be further reduced. Moreover, since the strength of the electric field applied to the gate insulating film 9 on the bottom portion of the gate trench 6 is alleviated by the reduction in the distance between the gate trenches 6, the breakdown voltage further increases. From the above, it becomes possible to improve the trade-off between the ON-resistance and the breakdown voltage and increase the device performance.

According to the manufacturing method of the first preferred embodiment, the depletion suppressing layer 8 which suppresses the extension of the depletion layer from the region having a p type is formed. This produces the effect of reducing the ON-resistance of the MOSFET 71. Further, the depletion suppressing layer 8 is formed by ion implantation into the side surface of the gate trench 6. It is thereby possible to easily give such a concentration distribution as to be reduced as the distance from the side surface of the gate trench 6 becomes larger, to the donor concentration of the depletion suppressing layer 8. It is thereby possible to suppress an increase in the electric field inside the drift layer 2 due to the depletion suppressing layer 8 while producing the effect of reducing the ON-resistance. Therefore, the reduction in the breakdown voltage can be suppressed. From the above, it is possible to suppress the reduction in the breakdown voltage while reducing the ON-resistance.

The step of forming the depletion suppressing layer 8 includes a step of emitting an oblique ion beam to the thickness direction of the silicon carbide layer 20. It is thereby possible to cause the ion beam to sufficiently reach the side surface of the gate trench 6.

Preferably, the step of forming the depletion suppressing layer 8 includes a step of emitting the ion beam at the first ion beam angle (an angle shallower than that indicated by the dashed arrow of FIG. 10) where only the region of the side surface of the gate trench 6, which is away from the bottom portion of the gate trench 6, is exposed to the ion beam and another step of emitting the ion beam at the second ion beam angle (an angle deeper than that indicated by the dashed arrow of FIG. 10) where the region including the bottom portion and the side surface of the gate trench 6 is exposed to the ion beam. More preferably, assuming that an ion beam angle at which a boundary between the side surface and the bottom portion of the gate trench 6 is exposed to the ion beam and the bottom portion of the gate trench 6 is not exposed to the ion beam, in other words, an angle indicated by the dashed arrow of FIG. 10, is the third ion beam angle, the difference between the third ion beam angle and each of the first ion beam angle and the second ion beam angle is within 15 degrees. This prevents the donor from being excessively implanted to the bottom portion of the gate trench 6. Therefore, it is possible to avoid excessive reduction in the effective impurity concentration of the trench bottom protective layer 7 having a p type, which is disposed on the bottom portion of the gate trench 6.

Variations

In the above description, as shown in FIG. 2, the cell structure has a stripe shape. The cell structure, however, is not limited to the stripe shape.

Figure 16:
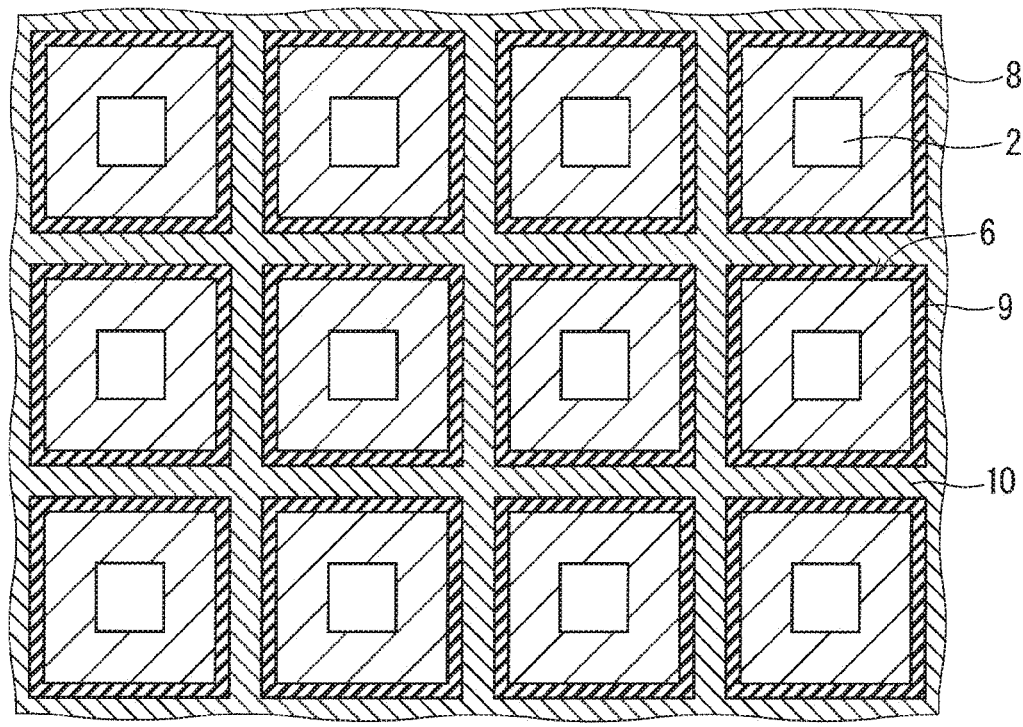
FIG. 16 is a partial cross section showing a first variation of FIG. 2.

FIG. 16 is a partial cross section showing a first variation of FIG. 2. In the present variation, the cell structure has a lattice arrangement. Further, the present variation also has a structure corresponding to the same cross section as that of FIG. 1, and there are a plurality of gate trenches 6 in the cross section. Furthermore, though the cells are aligned in the vertical direction and the horizontal direction in the FIG. 16, the cells does not always need to be aligned. Further, the shape of the cell is not limited to square, but may be any one of other rectangles such as oblong or the like, or a polygon other than the rectangle. The corner of the polygon may have a curvature.

Figure 17:
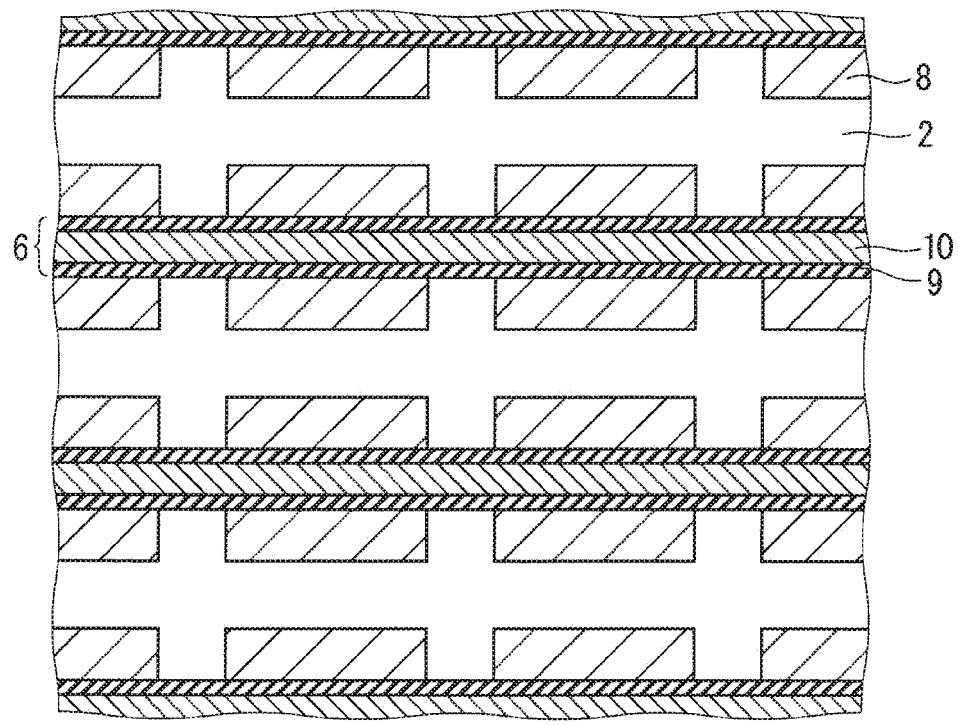
FIG. 17 is a partial cross section showing a second variation of FIG. 2.

FIG. 17 is a partial cross section showing a second variation of FIG. 2. In the present variation, the depletion suppressing layers 8 are arranged in an island-shaped configuration. Such an arrangement can be formed by patterning through photolithography.

In these variations, the pattern layout of the trench bottom protective layer 7 (FIG. 1) may be the same as that of the gate trench 6, though the width thereof may be different. Further, the depletion suppressing layers 8 are so provided as to sandwich the gate trench 6. Further, the pattern layout of the source region 3 (FIG. 1) may be also the same as that of the depletion suppressing layer 8, though the width thereof may be different.

Additional Notes

Though the above description has been made on the MOSFET, the silicon carbide semiconductor device is not limited to the MOSFET.

For example, the silicon carbide semiconductor device may be an IGBT. Though the drift layer 2 and the substrate 1 (buffer layer) have the same conductivity type in the above-described MOSFET 71, when the conductivity type of the substrate 1 is changed to one different from that of the drift layer 2, the IGBT can be achieved. Specifically, in the structure of FIG. 1, when the conductivity type of the substrate 1 is changed to a p type, instead of an n type, a structure of the IGBT is achieved. In that case, the source region 3 and the source electrode 11 in the MOSFET 71 correspond to an emitter region and an emitter electrode in the IGBT, respectively, and the drain electrode 12 in the MOSFET 71 corresponds to a collector electrode. Further, the method of achieving the IGBT is not limited to the above-described one. There may be a method, for example, where an n-type semiconductor layer is formed on n-type substrate, a p-type collector layer is formed on the n-type semiconductor layer, and then the n-type substrate is removed. A multilayer structure consisting of the n-type semiconductor layer and the p-type collector layer is thereby achieved. After that, by performing steps similar to those in the present preferred embodiment on the multilayer body, the IGBT is achieved.

As the gate insulating film, a film other than an oxide film can be used. Therefore, the silicon carbide semiconductor device may be a MOSFET (Metal-Insulator-Semiconductor Field Effect Transistor) other than the MOSFET.

Further, though the above description has been made on the case where the n type is used as the first conductivity type and the p type is used as the second conductivity type, these conductivity types may be exchanged. In that case, the words of "donor" and "acceptor" in the above description are replaced by each other.

Furthermore, the contents of the above-described Additional Notes can be applied to each of the other preferred embodiments described below.

The Second Preferred Embodiment

Figure 18:
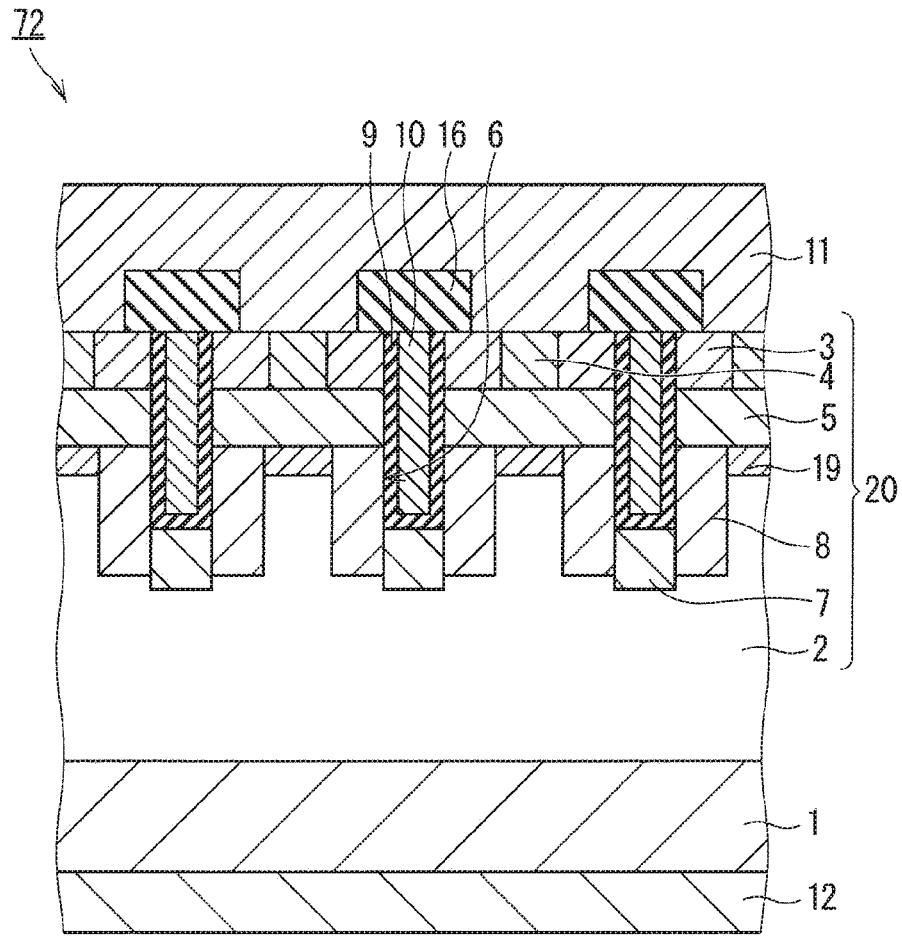
FIG. 18 is a partial cross section schematically showing a structure of a silicon carbide semiconductor device in accordance with a second preferred embodiment of the present invention.

FIG. 18 is a partial cross section schematically showing a structure of a MOSFET 72 (silicon carbide semiconductor device) in accordance with the second preferred embodiment of the present invention. In the MOSFET 72, the silicon carbide layer 20 has a high impurity concentration region 19. The high impurity concentration region 19 is disposed between the body region 5 and the depletion suppressing layer 8 in the depth direction and in contact with the drift layer 2. The high impurity concentration region 19 has an n type and has a donor concentration higher than that of the drift layer 2. The donor concentration of the high impurity concentration region 19 is $1 \times 10^{15}$ cm$^{-3}$ to $1 \times 10^{19}$ cm$^{-3}$. Also in the case where the high impurity concentration region 19 is provided as in the present preferred embodiment, the high impurity concentration region 19 is formed shallower than the depletion suppressing layer 8 so that the drift layer 2 is interposed between the depletion suppressing layers 8 like in the first preferred embodiment.

The donor concentration of the high impurity concentration region 19 may be substantially uniform in a direction parallel to the bottom surface of the gate trench 6 (in the horizontal direction in FIG. 18) at the same depth from the surface of the silicon carbide layer 20, unlike that of the depletion suppressing layer 8. The high impurity concentration region 19 is formed between the depletion suppressing layers 8 in the above direction.

Further, a pattern layout of the high impurity concentration region 19 can have a stripe shape or an island shape, corresponding to the cell structure. As a variation, a structure in which the high impurity concentration region 19 is not formed in the center portion between the gate trenches 6 may be used.

Figure 19:
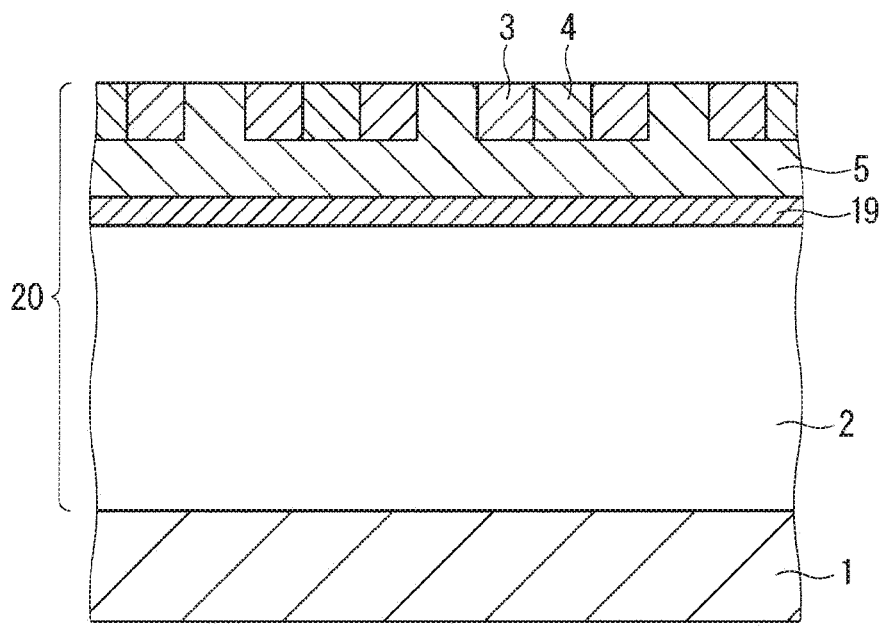
FIG. 19 is a partial cross section schematically showing one step of a method of manufacturing the silicon carbide semiconductor device of FIG. 18.

FIG. 19 is a partial cross section schematically showing one step of a method of manufacturing the MOSFET 72. By performing the step shown in this figure, instead of the step of FIG. 7 (the first preferred embodiment), the MOSFET 72 is achieved.

Further, since constituent elements other than the above are almost identical to those in the above-described first preferred embodiment or the variations thereof, the identical or corresponding constituent elements are represented by the same reference signs and description thereon will be omitted.

According to the second preferred embodiment, by providing the high impurity concentration region 19, the extension of the depletion layer from the body region 5 is suppressed. The ON-resistance can be thereby further reduced. The high impurity concentration region 19 also has a function of diffusing a current. With this function, the ON-resistance can be further reduced.

Further, only by additionally providing the high impurity concentration region 19 in the MOSFET 70 (FIG. 12) of the Comparative Example, an effect on the reduction in the breakdown voltage is large and it is difficult to achieve compatibility between an increase in the breakdown voltage and a reduction in the ON-resistance. By combining the high impurity concentration region 19 with the depletion suppressing layer 8, like in the present preferred embodiment, the above compatibility can be achieved.

The Third Preferred Embodiment

Figure 20:
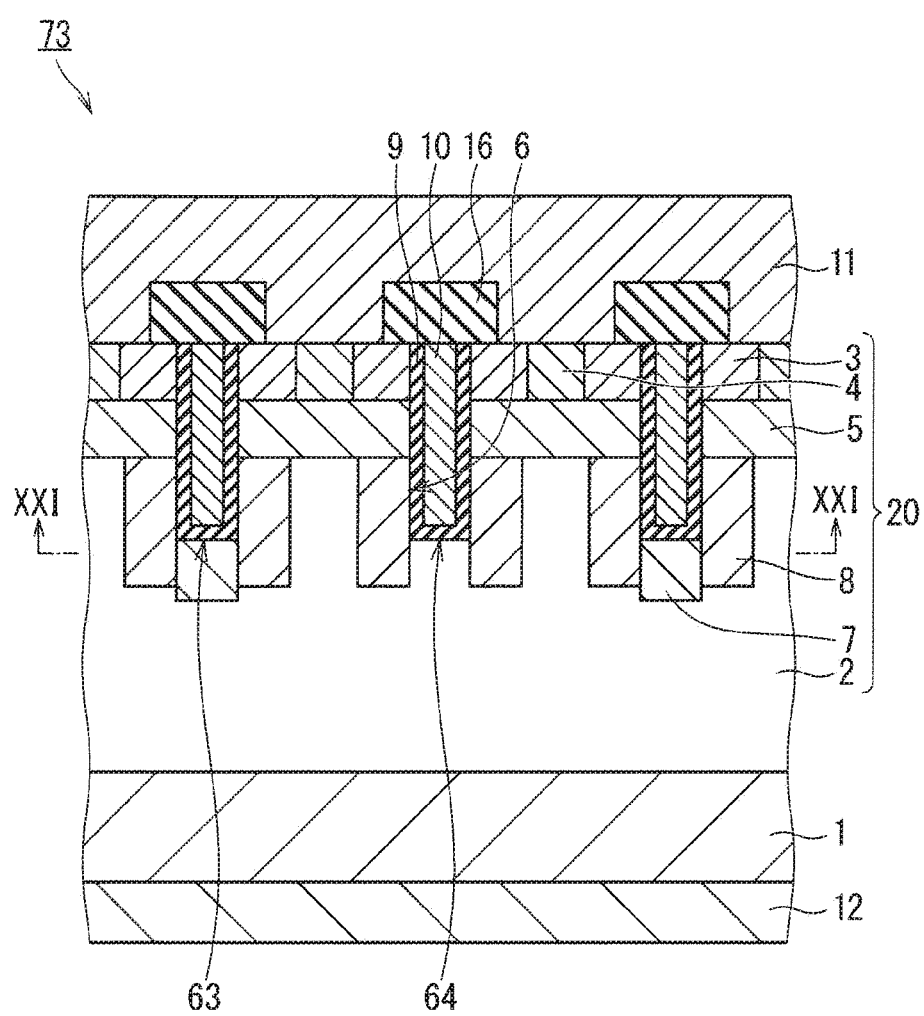
FIG. 20 is a view schematically showing a structure of a silicon carbide semiconductor device in accordance with a third preferred embodiment of the present invention and also a partial cross section along the line XX-XX of FIG. 21.
Figure 21:
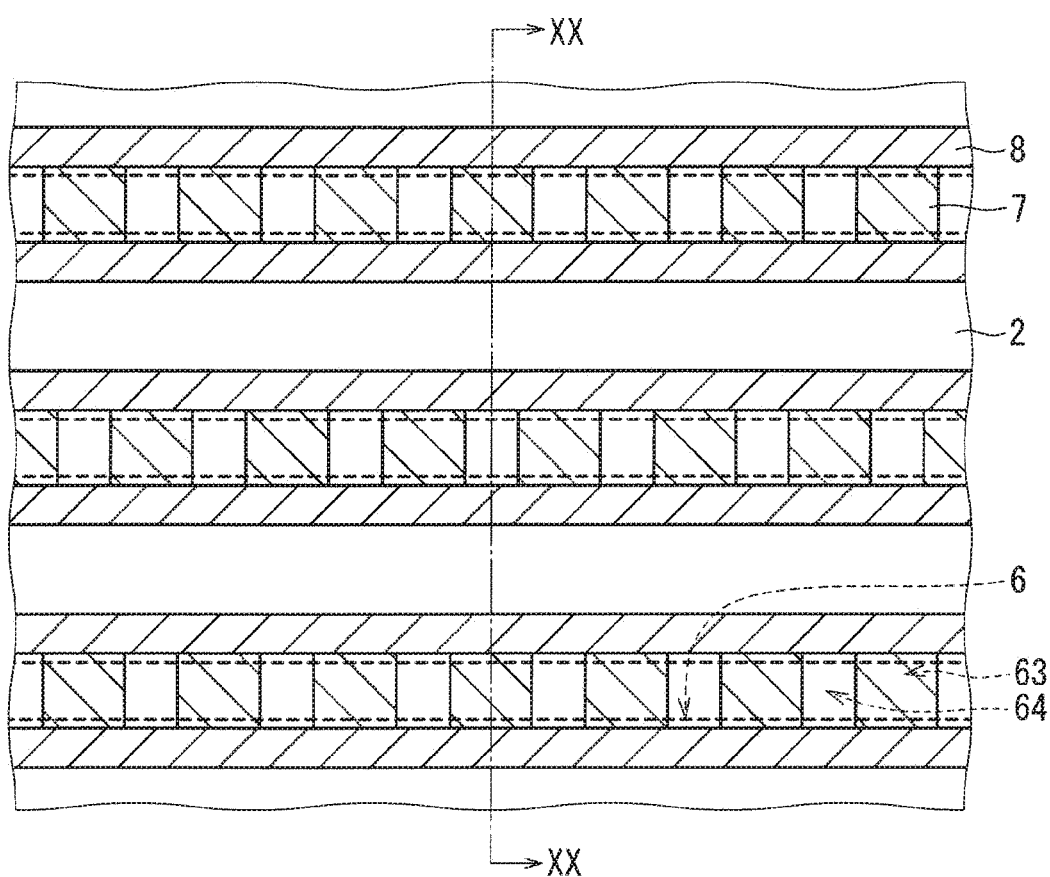
FIG. 21 is a partial cross section along the XXI-XXI of FIG. 20 and also a view corresponding to a pattern layout of a trench bottom protective layer and the depletion suppressing layer in a plan view.

FIG. 20 is a view schematically showing a structure of a MOSFET 73 (silicon carbide semiconductor device) in accordance with the third preferred embodiment of the present invention and also a partial cross section along the line XX-XX of FIG. 21. FIG. 21 is a partial cross section along the line XXI-XXI of FIG. 20 and also a view corresponding to a pattern layout of the trench bottom protective layer 7 and the depletion suppressing layer 8 in a plan view. In the MOSFET 73, the bottom portion of the gate trench 6 has a protected portion 63 provided with the trench bottom protective layer 7 and an unprotected portion 64 not provided with the trench bottom protective layer 7.

As shown in FIG. 21, in the present preferred embodiment, provided are a plurality of gate trenches 6 which are disposed in stripes, each of which extends in the longitudinal direction (the horizontal direction in this figure). In one cross section orthogonal to the longitudinal direction, i.e., in FIG. 20, the protected portion 63 and the unprotected portion 64 are periodically provided on a plurality of bottom portions of the plurality of gate trenches 6. As shown in FIG. 20, for example, each of the protected portion 63 and the unprotected portion 64 is provided at a cycle twice that of the gate trench 6. In other words, the protected portion 63 and the unprotected portion 64 are provided alternately. The side surface of the gate trench 6 has a portion which extends from the protected portion 63 and is provided with the depletion suppressing layer 8 and another portion which extends from the unprotected portion 64 and is provided with the depletion suppressing layer 8.

Figure 22:
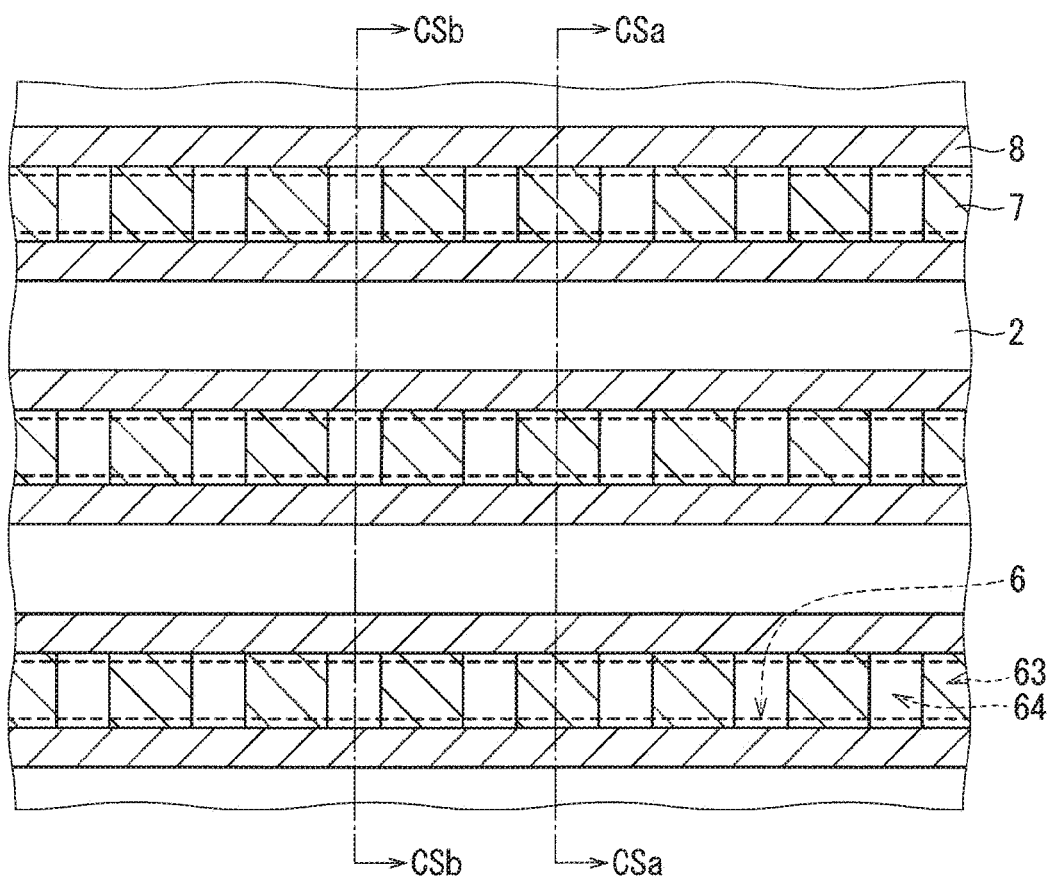
FIG. 22 is a view corresponding to a pattern layout of the trench bottom protective layer and the depletion suppressing layer in a plan view, showing a variation of FIG. 21.

FIG. 22 is a view corresponding to the pattern layout of the trench bottom protective layer 7 and the depletion suppressing layer 8 in a plan view, showing a variation of FIG. 21. In the present variation, in one cross section orthogonal to the longitudinal direction (a cross section along the line CSa-CSa in FIG. 22), the protected portion 63 are provided on all the plurality of bottom portions of the plurality of gate trenches 6. In another cross section orthogonal to the longitudinal direction (a cross section along the line CSb-CSb in FIG. 22), the unprotected portion 64 are provided on all the plurality of bottom portions of the plurality of gate trenches 6. In other words, in the cross section along the line CSb-CSb, no protected portion 63 is provided on each of the plurality of bottom portions of the plurality of gate trenches 6.

Figure 23:
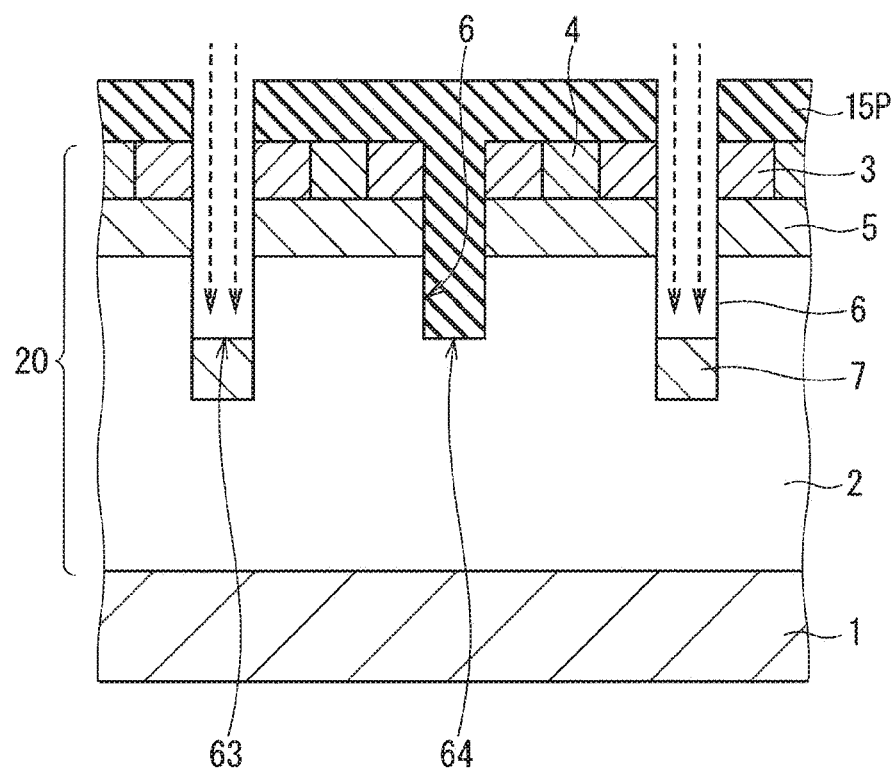
FIG. 23 is a partial cross section schematically showing one step of a method of manufacturing the silicon carbide semiconductor device of FIG. 20.

In a method of manufacturing the MOSFET 73, first, the same steps as those shown in FIGS. 6 to 8 in the first preferred embodiment are performed. Next, the silicon oxide film 15 is removed. With reference to FIG. 23, next, an implantation mask 15P is formed. The implantation mask 15P has a pattern layout to expose the protected portion 63 and cover the unprotected portion 64. Next, the trench bottom protective layer 7 is formed by ion implantation using the implantation mask 15P. Next, the implantation mask 15P is removed. After that, the same steps as those shown in FIG. 10 and the following figure in the first preferred embodiment are performed, to thereby achieve the MOSFET 73.

Further, since constituent elements other than the above are almost identical to those in the above-described first or second preferred embodiment or the variations thereof, the identical or corresponding constituent elements are represented by the same reference signs and description thereon will be omitted.

According to the third preferred embodiment, also in the region in which the JFET resistance is originally low since the trench bottom protective layer 7 is not provided, by providing the depletion suppressing layer 8, the JFET resistance is further reduced. This makes it possible to further reduce the ON-resistance.

The Fourth Preferred Embodiment

Structure

Figure 24:
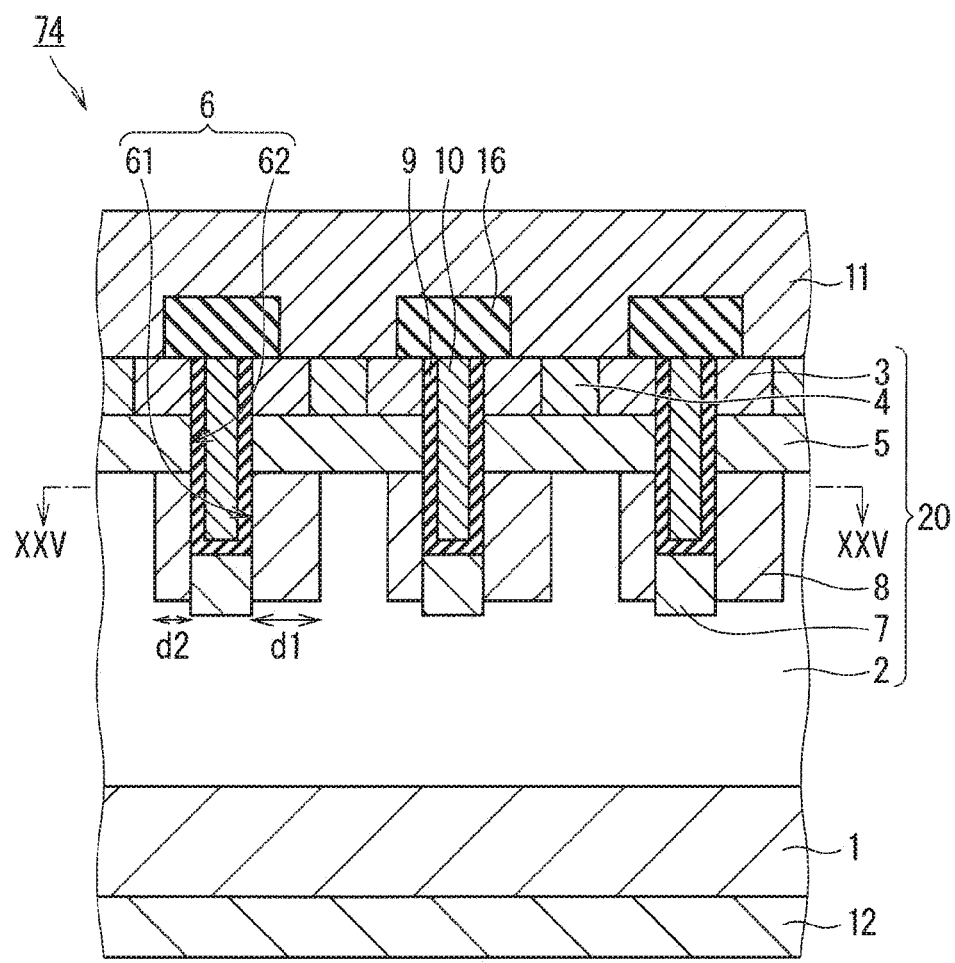
FIG. 24 is a view schematically showing it structure of a silicon carbide semiconductor device in accordance with a fourth preferred embodiment of the present invention and also a partial cross section along the line XXIV-XXIV of FIG. 25.
Figure 25:
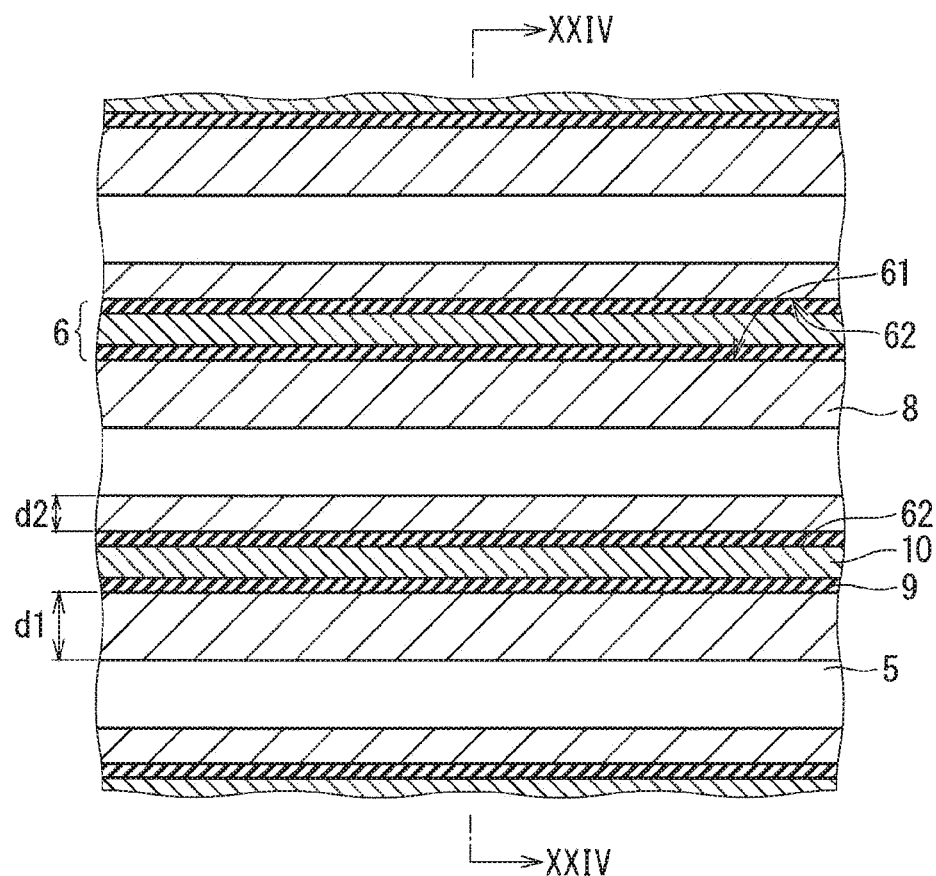
FIG. 25 is a partial cross section along the line XXV-XXV of FIG. 24 and also a view corresponding to a pattern layout of the gate trench and the depletion suppressing layer in a plan view.

FIG. 24 is a view schematically showing a structure of a MOSFET 74 (silicon carbide semiconductor device) in accordance with the fourth preferred embodiment of the present invention and also a partial cross section along the line XXIV-XXIV of FIG. 25. FIG. 25 is a partial cross section along the line XXV-XXV of FIG. 24 and also a view corresponding to a pattern layout of the gate trench and the depletion suppressing layer in a plan view. In the MOSFET 74, the side surface of the gate trench 6 has a first side surface portion 61 and a second side surface portion 62 having a plane direction different from that of the first side surface portion 61. Herein, the "different plane direction" refers to a plane direction which is crystallographically unequivalent. Particularly in an exemplary case specifically shown in FIG. 24, the first side surface portion 61 and the second side surface portion 62 face each other. In the depletion suppressing layer 8, a width d1 of a portion provided on the first side surface portion 61 and a width d2 of a portion provided on the second side surface portion 62 are different from each other.

The above structure is achieved by changing at least one of the energy and the amount of impurities to be implanted at the ion implantation between formation of a portion of the depletion suppressing layer 8 which is provided on the first side surface portion 61 and formation of another portion of the depletion suppressing layer 8 which is provided on the second side surface portion 62. As another method, a channeling effect which is an effect of changing the implantation depth in accordance with the plane direction may be used.

Further, since constituent elements other than the above are almost identical to those in the above-described first to third preferred embodiments or the variations thereof, the identical or corresponding constituent elements are represented by the same reference signs and description thereon will be omitted.

Effects

According to the fourth preferred embodiment, a variation in the channel characteristics due to the difference of the plane direction on the side surface of the gate trench 6 can be suppressed by controlling the width of the depletion suppressing layer 8. Therefore, it is possible to improve the trade-off between the ON-resistance and the breakdown voltage. Hereinafter, more specific description will be made on the suppression of the variation in the channel characteristics.

On the upper surface of the substrate 1 which is a silicon carbide single crystal substrate, an off angle is given in most cases. In that case, the first side surface portion 61 and the second side surface portion 62 in the gate trench 6 which face each other have different plane directions even when these portions are parallel to each other. Even when no off angle is given, a sidewall is provided with portions having different plane directions, depending on the structure of the gate trench 6. When the plane direction is different, the electron mobility is usually different. It is assumed, for example, that the electron mobility of the first side surface portion 61 is relatively low and the electron mobility of the second side surface portion 62 is relatively high. In this case, when a channel structure is simply formed by using those portions (in other words, the channel structure is formed symmetrically as shown in FIG. 1), there occurs a difference in the current density. Specifically, the second side surface portion 62 tends to carry a larger amount is current. This is not preferable for achieving MOSFET having a low ON-resistance and a high breakdown voltage.

According to the present preferred embodiment, the depletion suppressing layer 8 is provided on the first side surface portion 61 with a width d1 and on the second side surface portion 62 with a width d2 and the width d1 is set larger than the width d2. In the vicinity of the first side surface portion 61, the width of the low resistance region thereby becomes still larger, and therefore a drift resistance becomes lower. In other words, the lower electron mobility is compensated. Therefore, it is possible to suppress the variation in the channel characteristics due to the difference in the plane direction on the side surface of the gate trench 6.

Variations

Though the case has been described above where the width d1>the width d2>0, there may be a case where the width d1>the width d2=0. Specifically, the depletion suppressing layer 8 may be provided on the first side surface portion 61 and may not be provided on the second side surface portion 62. In other words, the depletion suppressing layer 8 may be provided only on the first side surface portion 61. Such a structure is especially effective for a case where the electron mobility of the first side surface portion 61 is lower than that of the second side surface portion 62, or for another case where the first side surface portion 61 is used as a channel and the second side surface portion 62 is not used as a channel. Further, even in such a structure, the drift layer 2 is interposed between the side surface of the depletion suppressing layer 8 provided on one of a pair of adjacent gate trenches 6 and that provided on the other one.

Figure 26:
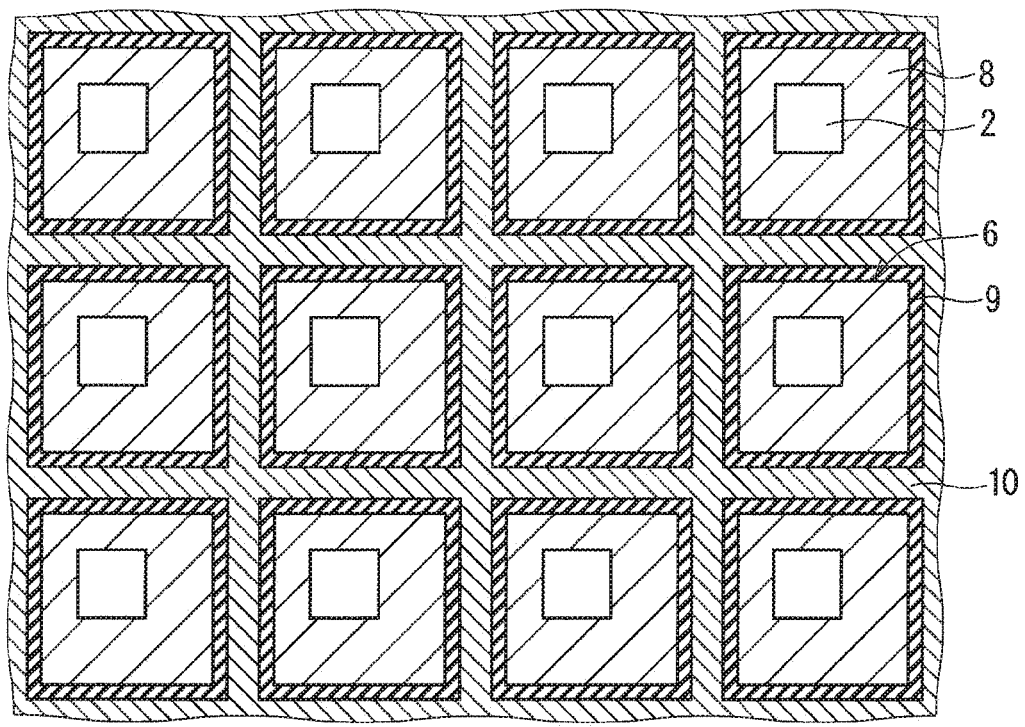
FIG. 26 is a partial cross section showing a variation of FIG. 25.

Though the width d1 of the depletion suppressing layer 8 and the width d2 thereof are different from each other in one direction (the vertical direction in FIG. 25) perpendicular to the extension direction of the stripe shape forming the cell structure in the above-described MOSFET 74, the widths of the depletion suppressing layer 8 may be made different in two directions or more. As shown in FIG. 26, for example, the widths of the depletion suppressing layer 8 may be made different in two directions (the vertical direction and the horizontal direction in this figure) perpendicular to the extension direction of the lattice shape forming the cell structure.

Further, though the widths of the depletion suppressing layer 8 are made different in the above description, at least one of structures of the depletion suppressing layer 8 relating to the widths, the donor concentrations, the depths, and the like may be made different. For example, a peak donor concentration (a peak impurity concentration of the first conductivity type) in a portion of the depletion suppressing layer 8 which is provided on the first side surface portion 61 and a peak donor concentration in another portion of the depletion suppressing layer 8 which is provided on the second side surface portion 62 may be made different from each other. Alternatively, a distribution of the donor concentration in the depth direction of a portion of the depletion suppressing layer 8 which is provided on the first side surface portion 61 and a distribution of the donor concentration in the depth direction of another portion of the depletion suppressing layer 8 which is provided on the second side surface portion 62 may be made different from each other. More alternatively, a distribution of the width in the depth direction of a portion of the depletion suppressing layer 8 which is provided on the first side surface portion 61 and a distribution of the width in the depth direction of another portion of the depletion suppressing layer 8 which is provided on the second side surface portion 62 may be made different from each other.

The Fifth Preferred Embodiment

Structure

Figure 27:
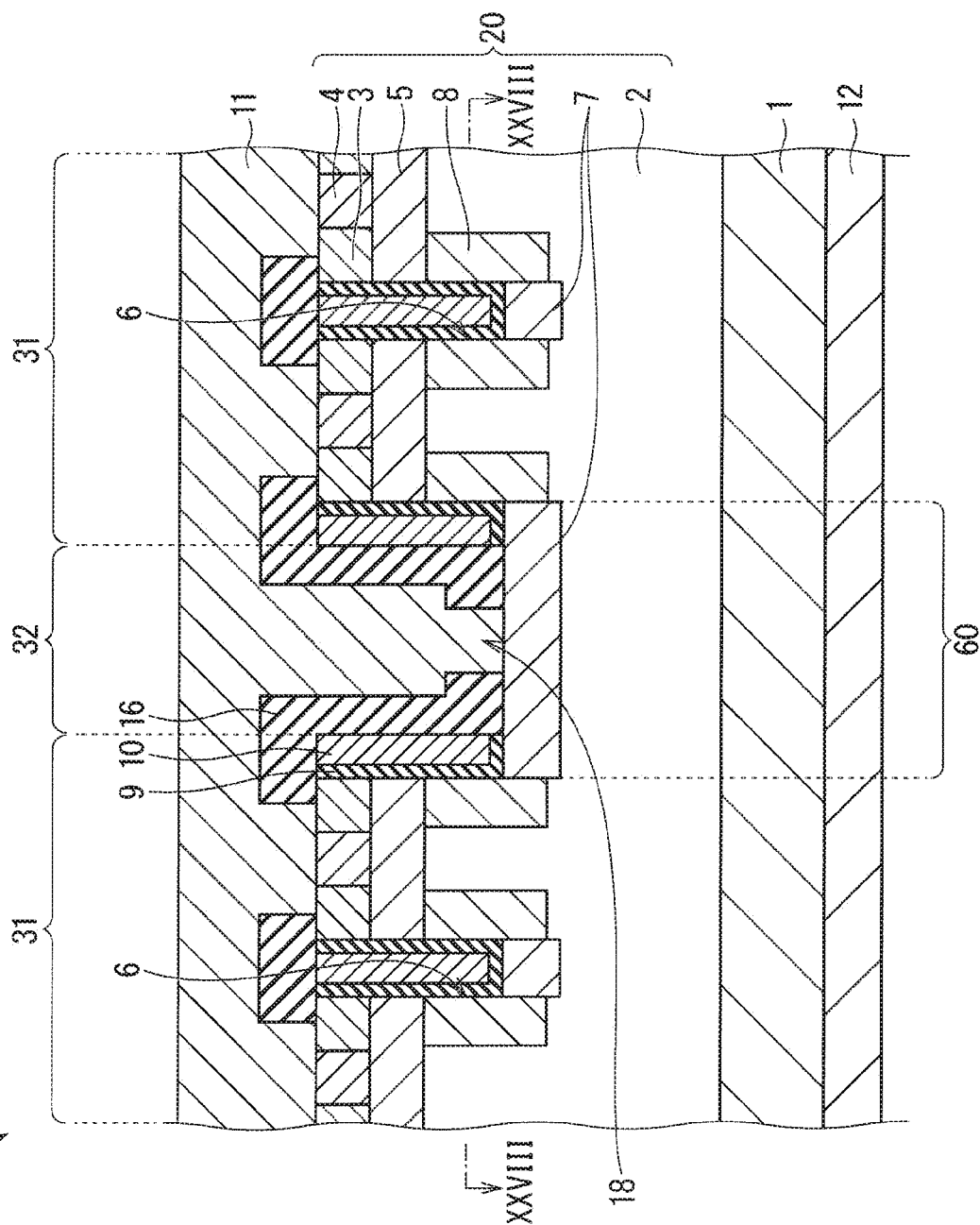
FIG. 27 is a view schematically showing a structure of a silicon carbide semiconductor device in accordance with a fifth preferred embodiment of the present invention and also a partial cross section along the line XXVII-XXVII of FIG. 28.
Figure 28:
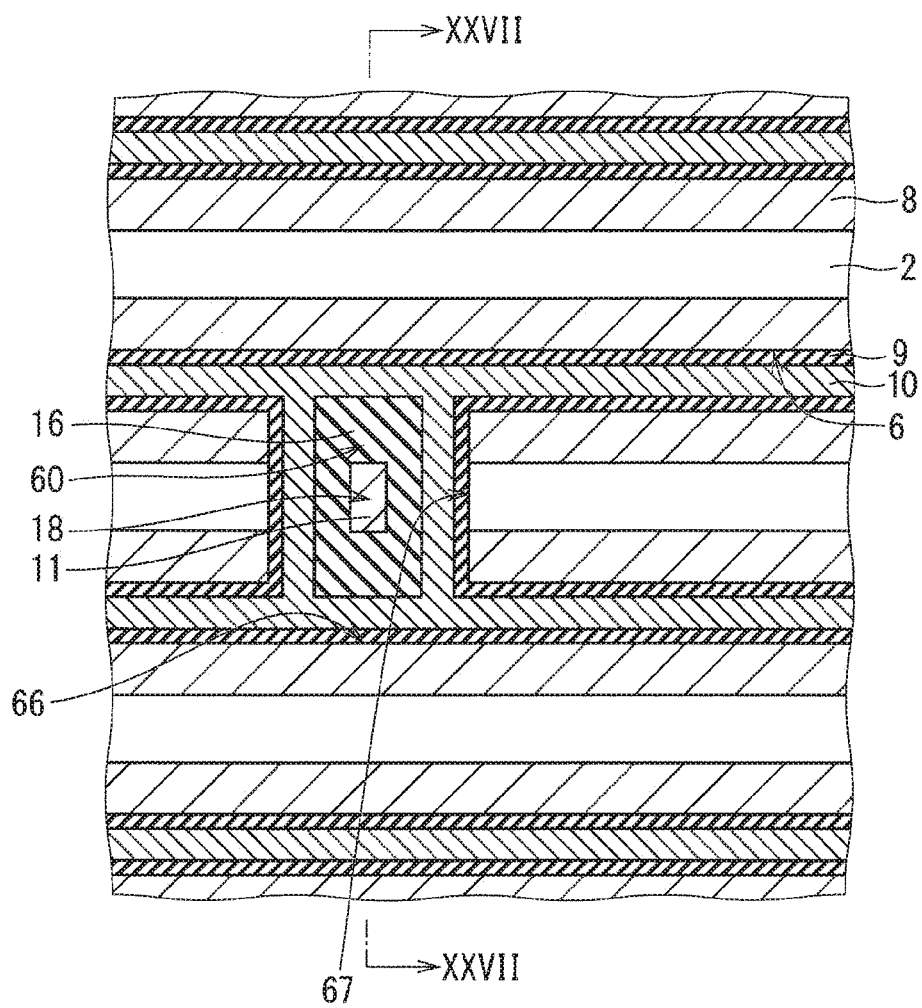
FIG. 28 is a partial cross section along the line XXVIII-XXVIII of FIG. 27 and also a view corresponding to a pattern layout of the gate trench, a contact trench, and the depletion suppressing layer in a plan view.

FIG. 27 is a view schematically showing a structure of a MOSFET 75 (silicon carbide semiconductor device) in accordance with the fifth preferred embodiment of the present invention and also a partial cross section along the line XXV-XXV of FIG. 28. FIG. 28 is a partial cross section along the line XXVIII-XXVIII of FIG. 27 and also a view corresponding to a pattern layout of the gate trench 6, a contact trench 60, and the depletion suppressing layer 8 in a plan view.

In the MOSFET 75, the contact trench 60 reaching the trench bottom protective layer 7 is provided in the silicon carbide layer 20. The source electrode 11 is in ohmic contact with the trench bottom protective layer 7 through the contact trench 60.

The depletion suppressing layer 8 has a portion provided between a side surface of the contact trench 60 and the drift layer 2. This portion extends from the lower portion of the body region 5 up to a position deeper than e bottom portion of the contact trench 60, as shown in FIG. 27. The side surface of the contact trench 60 may have a first side surface portion 66 and a second side surface portion 67 having a plane direction different from that of the first side surface portion 66, as shown in FIG. 28. The depletion suppressing layer 8 is provided on the first side surface portion 66 and the depletion suppressing layer 8 is not provided on the second side surface portion 67.

Like on the side surface of the gate trench 6, partially or entirely on the side surface of the contact trench 60, the gate insulating film 9 and the gate electrode 10 are disposed. At least part of the side surface of the contact trench 60 can be thereby used as a channel. Inside the contact trench 60, the gate electrode 10 and the source electrode 11 are isolated from each other by the interlayer insulating film 16. The interlayer insulating film 16 has a protective layer contact hole 18 through which the source electrode 11 is connected to the trench bottom protective layer 7. Therefore, the MOSFET 75 has an element region 31 provided with the gate electrode 10 and a protective layer contact region 32 provided with the protective layer contact hole 18 in a plan view.

Further, since constituent elements other than the above are almost identical to those in the above-described first to fourth preferred embodiments or the variations thereof, the identical or corresponding constituent elements are represented by the same reference signs and description thereon will be omitted.

Effects

According to the fifth preferred embodiment, the source electrode 11 is in ohmic contact with the trench bottom protective layer 7. The potential of the trench bottom protective layer 7 is fixed to that of the source electrode 11, to thereby be stabilized. Therefore, the switching rate of the MOSFET 75 can be increased. In other words, even in high speed switching operation, the effect of increasing the breakdown voltage by the trench bottom protective layer 7 can be sufficiently produced. Further, the electric field strength of the bottom portion of the contact trench 60 provided to achieve the above contact is reduced by the trench bottom protective layer 7. It is thereby possible to suppress the reduction in the breakdown voltage due to not only the gate trench 6 but also the contact trench 60.

The depletion suppressing layer 8 has a portion provided between the side surface of the contact trench 60 and the drift layer 2, and this portion extends from the lower portion of the body region 5 up to a position deeper than the bottom portion of the contact trench 60. With this structure, the extension of the depletion layer from the trench bottom protective layer 7 in the vicinity of the bottom portion of the contact trench 60 can be suppressed by the depletion suppressing layer 8. Therefore, the JFET resistance in the vicinity of the contact trench 60 is reduced. It is therefore possible to further reduce the ON-resistance of the MOSFET 75.

The side surface of the contact trench 60 may include the first side surface portion 66 provided with the depletion suppressing layer 8 and the second side surface portion 67 which has a plane direction different from that of the first side surface portion 66 and is not provided with the depletion suppressing layer 8. In accordance with the characteristics of the plane direction, the depletion suppressing layer 8 is thereby provided on only part of the side surface of the contact trench 60. Therefore, it is possible to avoid an increase in the electric field strength due to the depletion suppressing layer 8 in the vicinity of a portion not provided with the depletion suppressing layer 8 while effectively reducing the ON-resistance by the depletion suppressing layer 8. Further, for the reason similar to that in the above-described case of the fifth preferred embodiment, it is possible to suppress the variation in the channel characteristics due to the difference in the plane direction on the side surface of the contact trench 60.

Especially in the case where the plane direction of the second side surface portion 67 on the side surface of the contact trench 60 is different from each of the plane directions on the side surface of the gate trench 6, special consideration can be needed for preventing the reduction in the breakdown voltage due to the second side surface portion 67. As described above, by not providing the depletion suppressing layer 8 on the second side surface portion 67, it is possible to avoid such reduction in the breakdown voltage.

Further, the arrangement of the gate trenches 6 is not limited to the stripe arrangement as shown in FIG. 28, but for example, the lattice arrangement like in FIG. 16 may be used.

The Sixth Preferred Embodiment

Structure

Figure 29:
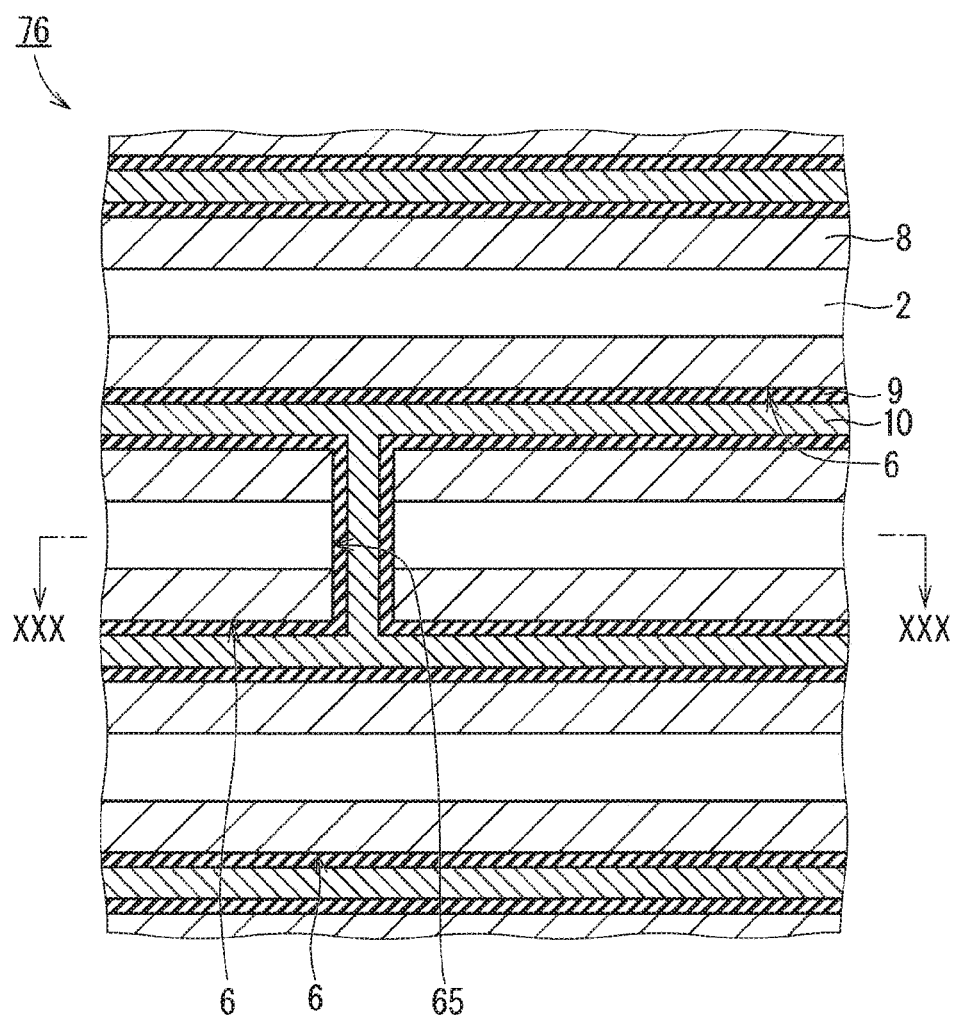
FIG. 29 is a view schematically showing a structure of a silicon carbide semiconductor device in accordance with a sixth preferred embodiment of the present invention, corresponding to a pattern layout of the gate trench and the depletion suppressing layer in a plan view and also a partial cross section along the line XXIX-XXIX of FIG. 30.
Figure 30:
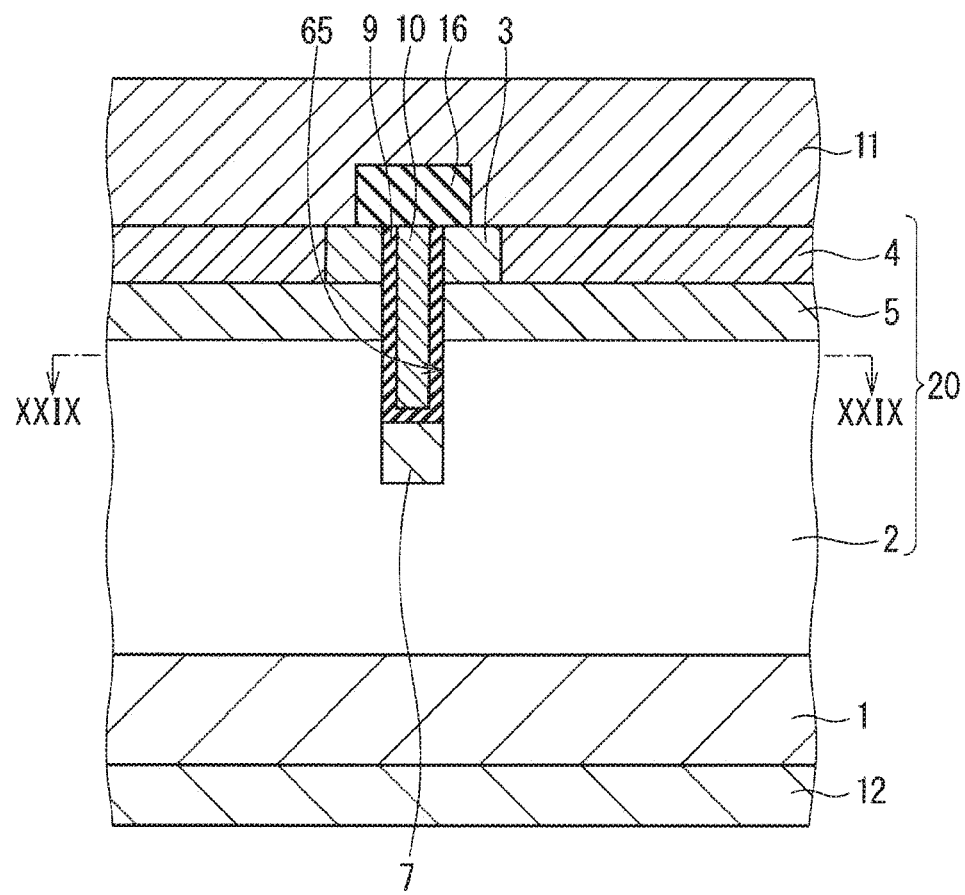
FIG. 30 is a partial cross section along the line XXX-XXX of FIG. 29.

FIG. 29 is a view schematically showing a structure of a MOSFET 76 (silicon carbide semiconductor device) in accordance with the sixth preferred embodiment of the present invention, corresponding to a pattern layout of the gate trench 6 and the depletion suppressing layer 8 in a plan view and also a partial cross section along the line XXIX-XXIX of FIG. 30. FIG. 30 is a partial cross section along the line XXX-XXX of FIG. 29.

In the present preferred embodiment, provided are a plurality of gate trenches 6 which are disposed in stripes, each of which extends in the longitudinal direction (the horizontal direction in FIG. 29). Further, provided is at least one intersection trench 65 which extends in a direction intersecting the longitudinal direction and has a depth equal to that of the gate trench 6. Preferably, the intersection trench 65 extends in a direction orthogonal to the longitudinal direction. The intersection trench 65 reaches a position deeper than the body region 5 (FIG. 30).

The gate insulating film 9 includes not only a portion provided inside the gate trench 6 but also a portion provided inside the intersection trench 65. The gate insulating film 9 faces the body region 5 and the source region 3 not only inside the gate trench 6 but also inside the intersection trench 65. The gate electrode 10 includes a portion provided inside the intersection trench 65. With this structure, a side surface of the intersection trench 65 can be used as a channel.

The trench bottom protective layer 7 includes a portion provided on a bottom portion of the intersection trench 65.

The side surface of the intersection trench 65 may be provided with the depletion suppressing layer 8 and may not be provided with the depletion suppressing layer 8. In other words, the side surface of the intersection trench 65 may include a portion which is not provided with the depletion suppressing layer 8 in the lower portion of the body region 5. In that case, as shown in FIG. 30, the side surface of the intersection trench 65 can include a portion provided with the drift layer 2 in the lower portion of the body region 5.

Further, since constituent elements other than the above are almost identical to those in the above-described first to fifth preferred embodiments or the variations thereof, the identical or corresponding constituent elements are represented by the same reference signs and description thereon will be omitted.

Effects

In the above-described respective structures of the first to fourth preferred embodiments or the variations thereof, the portion of the gate electrode 10 which is embedded inside the gate trench 6 extends along the gate trench 6 in the longitudinal direction, and the adjacent gate trenches 6 in a direction orthogonal to the longitudinal direction are not connected to each other. According to the sixth preferred embodiment, in contrast to this, these gate trenches 6 are connected to each other by the portion of the gate electrode 10 which is embedded inside the intersection trench 65. With this structure, the gate electrodes 10 in the MOSFET 76 are arranged in network. Therefore, an internal gate resistance of the MOSFET can be reduced.

Further, by providing a portion on at least part of the side surface of the intersection trench 65, which is not provided with the depiction suppressing layer 8, an imbalance in the current distribution in the MOSFET can be suppressed. This point will be described below.

Due to the difference in the extension direction of the trench, the side surface of the intersection trench 65 has a plane direction different from that of the side surface of the gate trench 6. For this reason, the channel formed of the side surface of the gate trench 6 and that formed of the side surface of the intersection trench 65 have different electrical characteristics due to the difference in the plane direction. This can cause an imbalance in the current inside the MOSFET. In the vicinity of the portion of the side surface of the intersection trench 65, which is not provided with the depletion suppressing layer 8, the channel has an electric resistance which is still higher. This can prevent the channel on the side surface of the intersection trench 65 from effectively operating. Therefore, it is possible to suppress the above-described imbalance in the current.

Further, in the lower portion of the body region 5, the side surface of the intersection trench 65 may include the portion which is not provided with the depletion suppressing layer 8, as described above. In an ion implantation step for forming the depletion suppressing layer 8, this eliminates the necessity of performing the ion implantation to the entire side surface of the intersection trench 65. Therefore, it is possible to reduce the number of ion implantations.

Seventh Preferred Embodiment

Figure 31:
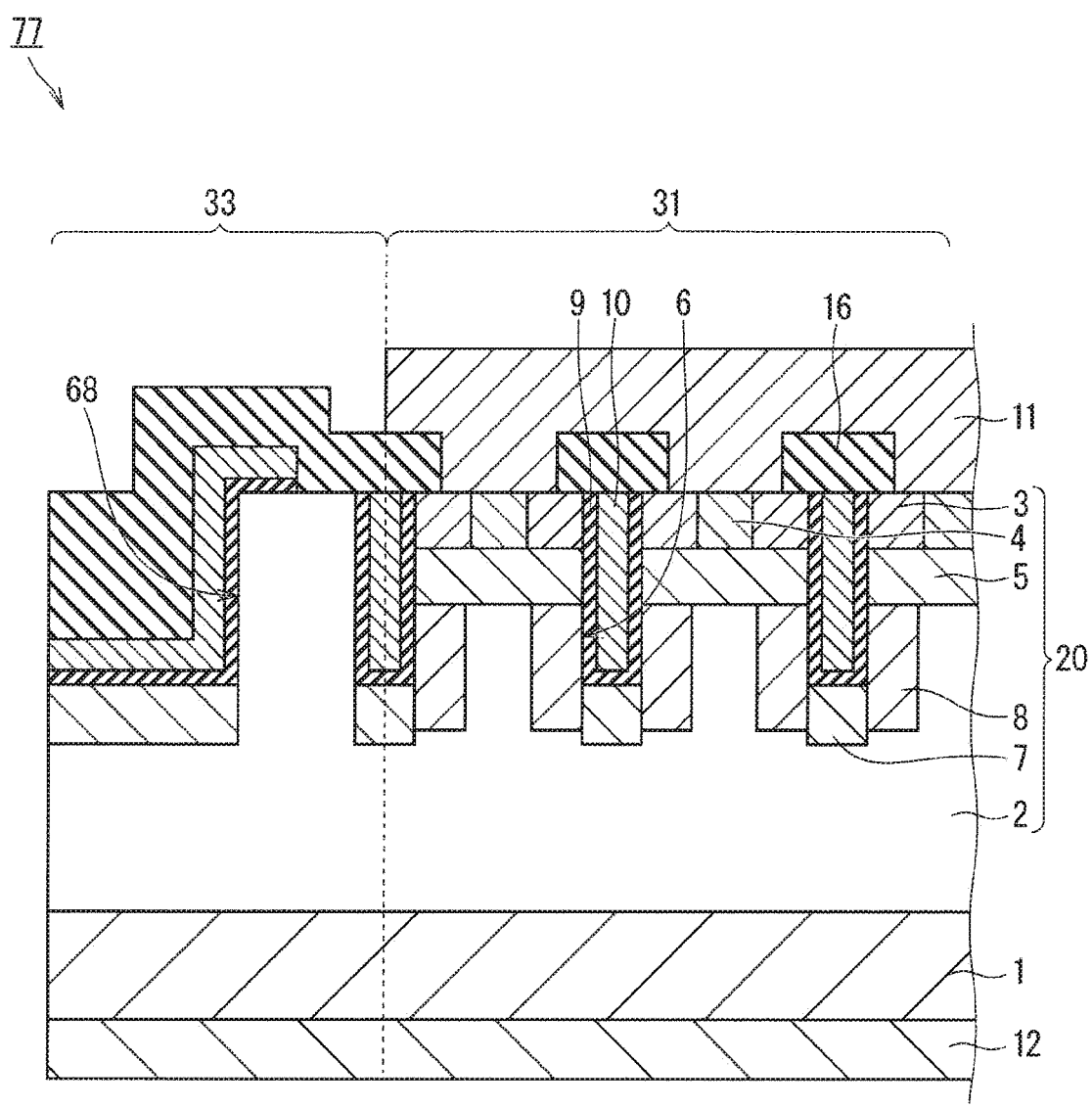
FIG. 31 is a partial cross section schematically showing a structure of a silicon carbide semiconductor device in accordance with a seventh preferred embodiment of the present invention.

FIG. 31 is a partial cross section schematically showing a structure of a MOSFET 76 (silicon carbide semiconductor device) in accordance with the seventh preferred embodiment of the present invention. The MOSFET 76 has the element region 31 provided with the gate trench 6 and an outer peripheral region 33 disposed outside the element region 31. Further, the element region 31 has the same structure as those in the first to fourth preferred embodiments or the variations thereof. Furthermore, like in the fifth preferred embodiment, the protective layer contact region 32 (FIG. 27) may be additionally provided.

The outer peripheral region 33 is provided with an outer peripheral trench 68. On at least one of a side surface of the outer peripheral trench 68 and the side surface of the gate trench 6 which faces the side surface of the outer peripheral trench 68, the depletion suppressing layer 8 is not provided. In the structure shown in FIG. 31, the depletion suppressing layer 8 is not provided on each of the side surfaces. Especially, it is preferable that the depletion suppressing layer 8 should not be provided on the side surface of the outer peripheral trench 68.

According to the seventh preferred embodiment, the depletion suppressing layer 8 is not provided on at least one of the side surface of the outer peripheral trench 68 and the side surface of the gate trench 6 which faces the side surface of the outer peripheral trench 68. Since the outer peripheral region 33 is not usually used as the current path in an ON time, even if the depletion suppressing layer 8 is not provided therein, this has little effect on the ON-resistance. On the other hand, in the outer peripheral region 33, it is possible to suppress an increase in the electric field due to the depletion suppressing layer 8. Therefore, without any major adverse effect on the ON-resistance, it is possible to further increase the breakdown voltage.

Especially, since the side surface of the outer peripheral trench 68 is used as the current path, there is no advantage of providing the depletion suppressing layer 8 thereon. Therefore, in order to suppress an increase in the electric field strength on the bottom portion of the trench, it is preferable that the depletion suppressing layer 8 should not be provided on the side surface of the outer peripheral trench 68.

Further, though description has been made on the semiconductor device (silicon carbide semiconductor device) formed of silicon carbide, which is one of wide bandgap semiconductors, in the first to sixth preferred embodiments, these preferred embodiments can be applied to, for example, semiconductor devices (wide bandgap semiconductor devices) using other wide bandgap semiconductors such as a gallium nitride (GaN) based material, diamond, or the like.

The Eighth Preferred Embodiment

The eighth preferred embodiment is a case where the silicon carbide semiconductor device in accordance with any one of the above-described first to sixth preferred embodiments or the variations thereof is applied to a power converter. The present invention is not limited to a specific power converter, but a case of applying the silicon carbide semiconductor device to a three-phase inverter, as the eighth preferred embodiment, will be described below.

Figure 32:
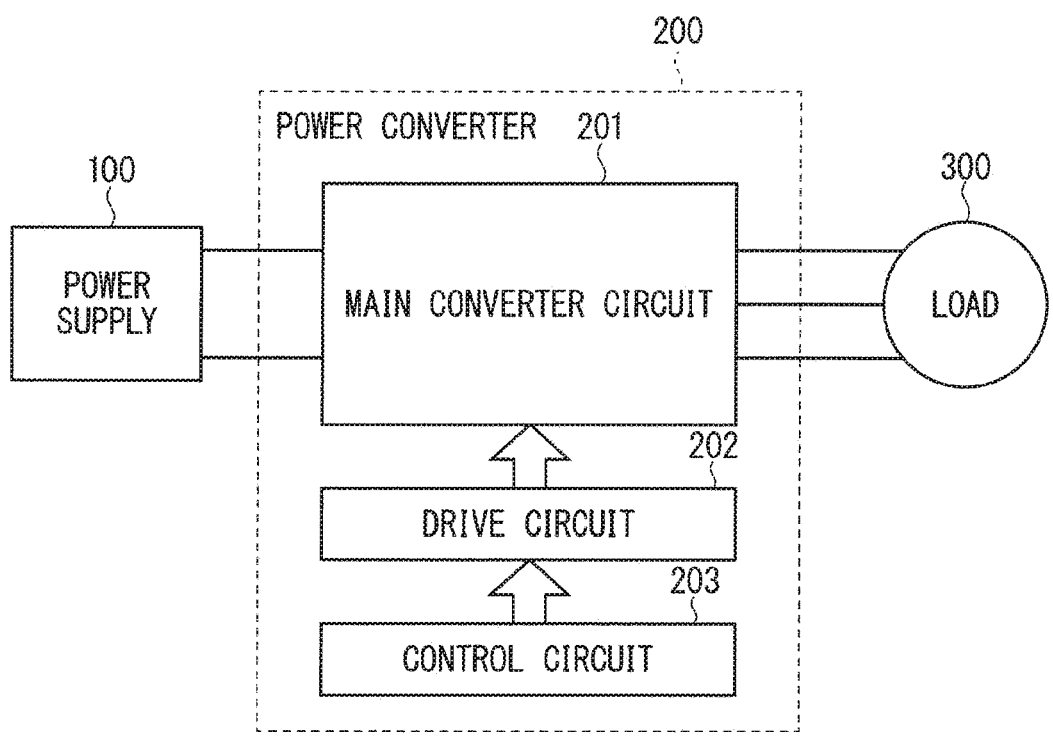
FIG. 32 is a block diagram schematically showing a constitution of a power conversion system to which a power converter in accordance with an eighth preferred embodiment of the present invention is applied.

FIG. 32 is a block diagram schematically showing a constitution of a power conversion system to which a power converter 200 in accordance with the eighth preferred embodiment of the present invention is applied.

The power converter 200 is a three-phase inverter which is connected between a power supply 100 and a load 300, and converts direct current (DC) power suppled from the power supply 100 into alternating current (AC) power and supplies the alternating current power to the load 300. The power converter 200 has a main converter circuit 201, a drive circuit 202, and a control circuit 203. The main converter circuit 201 has the above-described silicon carbide semiconductor device as a switching element, and converts the inputted direct current power into the alternating current power and outputs the alternating current power. The drive circuit 202 outputs a drive signal which drives each of the silicon carbide semiconductor devices as the switching element to the silicon carbide semiconductor device. The control circuit 203 outputs a control signal which controls the drive circuit 202 to the drive circuit 202.

The power supply 100 is a DC power supply and supplies the direct current power to the power converter 200. The power supply 100 can be formed of some of various elements, and for example, can be formed of a DC system, a solar battery, or a storage battery, or may be formed of a rectifier circuit connected to an AC system, or an AC/DC converter. Further, the power supply 100 may be formed of a DC/DC converter which converts direct current power outputted from the DC system into predetermined electric power.

The load 300 is a three-please electric motor which is driven by the alternating current power supplied from the power converter 200. Further, the load 300 is not limited to a specific use but is an electric motor mounted on any one of various electric equipments, and is, for example, used as an electric motor for a hybrid vehicle, an electric vehicle, a railway vehicle, an elevator, or an air conditioner.

Hereinafter, a detail of the power converter 200 will be described. The main converter circuit 201 comprises a switching element and a reflux diode (not shown). When the switching element performs a switching operation, the main converter circuit 201 converts the direct current power supplied from the power supply 100 into the alternating current power and supplies the alternating current power to the load 300. A specific circuit configuration of the main converter circuit 201 may be any one of various configurations, and the main converter circuit 201 in accordance with the present preferred embodiment is a two-level three-phase full-bridge circuit and can be constituted of six switching elements and six reflux diodes which are connected in inverse parallel to the switching elements, respectively. The six switching elements form (three) upper and lower arms in each of which two switching elements are connected in series to each other, and the upper and lower arms form three phases (U-phase, V-phase, and W-phase) of the full-bridge circuit, respectively. Then, respective output terminals of the upper and lower arms, i.e., three output terminals of the main converter circuit 201 are connected to the load 300.

The drive circuit 202 generates the drive signals which drive the switching elements of the main converter circuit 201 and supplies the drive signals to respective control electrodes of the switching elements of the main converter circuit 201. Specifically, in accordance with the control signal from the control circuit 203 described later, the drive circuit 202 outputs a drive signal for bringing the switching element into an ON state and another drive signal for bringing the switching element into an OFF state to the control electrode of each of the switching elements. In a case of keeping the switching element in an ON state, the drive signal is a voltage signal (ON signal) having a threshold voltage of the switching element or higher, and in a case of keeping the switching element in an OFF state, the drive signal is a voltage signal (OFF signal) having the threshold voltage of tire switching element or lower.

The control circuit 203 controls the switching element of the main converter circuit 201 so that desired electric power may be supplied to the load 300. Specifically, the control circuit 203 calculates a time (ON time) when each switching element of the main converter circuit 201 comes into an ON state, on the basis of the electric power to be supplied to the load 300. For example, the main converter circuit 201 can be controlled by the PWM (Pulse Wide Modulation) control which modulates the ON time of the switching element in accordance with the voltage to be outputted. Then, at each point in time, the control circuit 203 outputs a control command (control signal) to the drive circuit 202 so as to output the ON signal to the switching element to be brought into an ON state and output the OFF signal to the switching element to be brought into an OFF state. In accordance with this control signal, the drive circuit 202 outputs the ON signal or the OFF signal as the drive signal to the control electrode of each switching element.

A method of manufacturing the power converter 200 has the following steps. By the method of manufacturing the silicon carbide semiconductor device, which has been described in the above-described first to sixth preferred embodiments or the variations thereof, the silicon carbide semiconductor device manufactured. Then, the main converter circuit 201 having this silicon carbide semiconductor device, the drive circuit 202 and the control circuit 203 are formed.

According to the power converter 200 of the eighth preferred embodiment, the main converter circuit 201 has the silicon carbide semiconductor device of any one of the first to sixth preferred embodiments or the variations thereof as the switching element. It is thereby possible to suppress the reduction in the breakdown voltage of the switching element while reducing the ON-resistance of the switching element. Therefore, it is possible to increase the reliability of the power converter 200 while reducing power loss.

Though the above description has been made by taking the application to the two-level three-phase inverter as an example in the present preferred embodiment, the present invention is not limited to this example, but may be applied to any one of various power converters. Though the power converter is two-level power converter in the present preferred embodiment, the power converter may be a multilevel power converter such as a three-level one or the like. Further, in a case of supplying electric power to a single phase load, the present invention may be applied to a single phase inverter. Furthermore, in a case of supplying electric power to a DC load or the like, the present invention can be applied to the DC/DC converter or the AC/DC converter.

Further, the power converter to which the present invention is applied is not limited to the above-described case where the load is an electric motor, but can be used as, for example, a power supply device of any one of an electrical discharge machine, a laser processing machine, an induction heating cooker, and a non-contact power supply system and further can be used as a power conditioner of a photovoltaic (PV) power generation system, a power storage system, or the like.

Further, in the present invention, the preferred embodiments may be freely combined, or may be changed or omitted as appropriate, without departing from the scope of the invention. While the invention has been shown and described in detail, the foregoing description, is in all aspects illustrative and not restrictive. It is therefore understood that numerous modifications and variations can be devised without departing from the scope of the invention.

EXPLANATION OF REFERENCE SIGNS 1 substrate, 2 drift layer, 3 source region, 4 body contact region, 5 body region, 6 gate trench, 7 trench bottom protective layer, 8 depletion suppressing layer, 9 gate insulating film, 10 gate electrode, 11 source electrode, 12 drain electrode, 15 silicon oxide film, 15P implantation mask, 16 interlayer insulating film, 18 protective layer contact hole, 19 high impurity concentration region, 20 silicon carbide layer (semiconductor layer), 31 element region, 32 protective layer contact region, 33 outer peripheral region, 60 contact trench, 61, 66 first side surface portion, 62, 67 second side surface portion, 63 protected portion, 64 unprotected portion, 65 intersection trench, 68 outer peripheral trench, 71 to 77 MOSFET (silicon carbide semiconductor device), 100 power supply, 200 power converter, 201 main converter circuit, 202 drive circuit, 203 control circuit, 300 load

The invention claimed is:

1. A silicon carbide semiconductor device, comprising:
a drift layer formed of silicon carbide, having a first conductivity type;
a body region provided on the drift layer, having a second conductivity type different from the first conductivity type;
a source region provided on the body region, having the first conductivity type;
a gate insulating film provided inside at least one gate trench reaching a position deeper than the body region in a depth direction, facing the body region and the source region, the gate trench having a width direction perpendicular to the depth direction;
a gate electrode provided inside the gate trench, facing the body region with the gate insulating film interposed therebetween;
a source electrode electrically connected to the source region;
a trench bottom protective layer being in contact with a bottom portion of the gate trench, having the second conductivity type with an impurity concentration higher than that of the body region; and
a depletion suppressing layer provided between a side surface of the gate trench and the drift layer in the width direction, being in contact with a side surface of the trench bottom protective layer, extending from a lower portion of the body region up to a position deeper than the bottom portion of the gate trench, having the first conductivity type, and having an impurity concentration of the first conductivity type higher than that of the drift layer, and
wherein the impurity concentration of the first conductivity type of the depletion suppressing layer is reduced as the distance from the side surface of the gate trench becomes larger, and
an impurity concentration of an entirety of the drift layer is lower than that of an entirety of the depletion suppressing layer, and
a width of the trench bottom protective layer is smaller than a width of the gate trench.

2. The silicon carbide semiconductor device according to claim 1, further comprising:
a high impurity concentration region disposed between the body region and the depletion suppressing layer in the depth direction, being in contact with the drift layer, having the first conductivity type, and having an impurity concentration of the first conductivity type higher than that of the drift layer.

3. The silicon carbide semiconductor device according to claim 1, wherein
the at least one gate trench includes a plurality of gate trenches and the plurality of gate trenches include a pair of gate trenches adjacent to each other in a cross section, and
the drift layer has a portion extending from a side surface of the depletion suppressing layer provided on one of the pair of gate trenches up to a side surface of the depletion suppressing layer provided on the other one of the pair of gate trenches.

4. A silicon carbide semiconductor device, comprising:
a drift layer formed of silicon carbide, having a first conductivity type;
a body region provided on the drift layer, having a second conductivity type different from the first conductivity type;
a source region provided on the body region, having the first conductivity type;
a gate insulating film provided inside at least one gate trench reaching a position deeper than the body region in a depth direction, facing the body region and the source region, the gate trench having a width direction perpendicular to the depth direction;
a gate electrode provided inside the gate trench, facing the body region with the gate insulating film interposed therebetween;
a source electrode electrically connected to the source region;

a trench bottom protective layer being in contact with a bottom portion of the gate trench, having the second conductivity type with an impurity concentration higher than that of the body, region;

a depletion suppressing layer provided between a side surface of the gate trench and the drill layer in the width direction, being in contact with a side surface of the trench bottom protective layer, extending from a lower portion of the body region up to a position deeper than the bottom portion of the gate trench, having the first conductivity type, and having an impurity concentration of the first conductivity type higher than that of the drift layer, and a high impurity concentration region disposed between the body region and the depletion suppressing layer in the depth direction, being in contact with the drift layer, having the first conductivity type, and having an impurity concentration of the first conductivity type higher than that of the drift layer, wherein the impurity concentration of the first conductivity type of the depletion suppressing layer is reduced as the distance from the side surface of the gate trench becomes larger, and an impurity concentration of an entirety of the drift layer is lower than that of an entirety of the depletion suppressing layer.

* * * * *